(12) United States Patent
Brcka

(10) Patent No.: US 8,092,658 B2
(45) Date of Patent: Jan. 10, 2012

(54) METHOD AND APPARATUS OF DISTRIBUTED PLASMA PROCESSING SYSTEM FOR CONFORMAL ION STIMULATED NANOSCALE DEPOSITION PROCESS

(75) Inventor: Jozef Brcka, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 491 days.

(21) Appl. No.: 11/835,067

(22) Filed: Aug. 7, 2007

(65) Prior Publication Data

US 2008/0026574 A1   Jan. 31, 2008

Related U.S. Application Data

(62) Division of application No. 10/854,607, filed on May 26, 2004, now abandoned.

(51) Int. Cl.
*C23C 14/34* (2006.01)
(52) U.S. Cl. .............................. 204/192.12; 204/298.06
(58) Field of Classification Search ............. 204/192.12, 204/298.06
See application file for complete search history.

(56) References Cited

U.S. PATENT DOCUMENTS

| | | | |
|---|---|---|---|
| 4,500,408 A | 2/1985 | Boys et al. | |
| 4,874,494 A | 10/1989 | Ohmi | |
| 4,888,199 A | 12/1989 | Felts et al. | |
| 4,987,346 A | 1/1991 | Katzschner et al. | |
| 4,999,096 A | 3/1991 | Nihei et al. | |
| 5,026,471 A | 6/1991 | Latz et al. | |
| 5,272,417 A | 12/1993 | Ohmi | |
| 5,770,025 A | 6/1998 | Kiyota | |
| 5,800,688 A | 9/1998 | Lantsman et al. | |

(Continued)

FOREIGN PATENT DOCUMENTS

EP   1106709 A2   6/2001

(Continued)

OTHER PUBLICATIONS

Rossnagel, Directional and iPVD for Microelectronics Applications, J. Vac. Sci. Technol. B 16(5), 2585-2608, Sep. Oct. 1998.

(Continued)

*Primary Examiner* — Keith Hendricks
*Assistant Examiner* — Jason M Berman
(74) *Attorney, Agent, or Firm* — Wood, Herron & Evans, LLP

(57) ABSTRACT

A deposition system and method of operating thereof is described for depositing a conformal metal or other similarly responsive coating material film in a high aspect ratio feature using a high density plasma is described. The deposition system includes a plasma source, and a distributed metal source for forming plasma and introducing metal vapor to the deposition system, respectively. The deposition system is configured to form a plasma having a plasma density and generate metal vapor having a metal density, wherein the ratio of the metal density to the plasma density proximate the substrate is less than or equal to unity. This ratio should exist at least within a distance from the surface of the substrate that is about twenty percent of the diameter of the substrate. A ratio that is uniform within plus or minus twenty-five percent substantially across the surface of said substrate is desirable. The ratio is particularly effective for plasma density exceeding $10^{12}$ cm$^{-3}$, and for depositing film on substrates having nanoscale features with maximum film thickness less than half of the feature width, for example, at ten percent of the feature width.

17 Claims, 14 Drawing Sheets

U.S. PATENT DOCUMENTS

| | | | |
|---|---|---|---|
| 5,907,220 | A | 5/1999 | Tepman et al. |
| 5,976,334 | A | 11/1999 | Fu et al. |
| 6,024,826 | A | 2/2000 | Collins et al. |
| 6,033,541 | A | 3/2000 | Xu et al. |
| 6,045,666 | A | 4/2000 | Satitpunwaycha et al. |
| 6,100,200 | A | 8/2000 | Van Buskirk et al. |
| 6,117,279 | A | 9/2000 | Smolanoff et al. |
| 6,143,140 | A | 11/2000 | Wang et al. |
| 6,153,068 | A | 11/2000 | Ohmi et al. |
| 6,193,855 | B1 * | 2/2001 | Gopalraja et al. ....... 204/192.12 |
| 6,197,165 | B1 | 3/2001 | Drewery et al. |
| 6,217,721 | B1 | 4/2001 | Xu et al. |
| 6,228,235 | B1 | 5/2001 | Tepman et al. |
| 6,231,725 | B1 * | 5/2001 | Nulman et al. .......... 204/192.12 |
| 6,251,242 | B1 | 6/2001 | Fu et al. |
| 6,274,008 | B1 | 8/2001 | Gopalraja et al. |
| 6,277,249 | B1 | 8/2001 | Gopalraja et al. |
| 6,290,825 | B1 | 9/2001 | Fu |
| 6,306,265 | B1 | 10/2001 | Fu et al. |
| 6,340,417 | B1 | 1/2002 | Krivokapic |
| 6,375,743 | B2 | 4/2002 | Sundarrajan et al. |
| 6,380,684 | B1 | 4/2002 | Li et al. |
| 6,413,382 | B1 | 7/2002 | Wang et al. |
| 6,432,819 | B1 | 8/2002 | Pavate et al. |
| 6,451,177 | B1 | 9/2002 | Gopalraja et al. |
| 6,554,979 | B2 | 4/2003 | Stimson |
| 6,699,783 | B2 | 3/2004 | Raaijmakers et al. |
| 6,755,945 | B2 | 6/2004 | Yasar et al. |
| 6,875,321 | B2 | 4/2005 | Ding et al. |
| 7,026,174 | B2 | 4/2006 | Fischer |
| 2003/0038025 | A1 | 2/2003 | Ngan et al. |

FOREIGN PATENT DOCUMENTS

| | | |
|---|---|---|
| JP | 01240656 | 9/1989 |
| JP | 02225667 | 9/1990 |
| JP | 06181187 | 6/1994 |
| WO | 03/056603 A | 7/2003 |

OTHER PUBLICATIONS

State Intellectual Property Office of the People's Republic of China (SIPO), The First Office Action, from corresponding Chinese Application No. 200580016941.3, dated Oct. 31, 2008.

* cited by examiner

- C(B/FF)S.R.
- C(SW/B)S.R.
- DR(FF)
- Predicted process window where SW/B and B/FF ~ 40-100 %-conformal coverage
- PROCESS I:
  - DC ~ 1-3 kW
  - BAIS has two levels in time:
    - Unbiased
    - Biased @20% net D.R.(of unbiased D.R.)
- PROCESS II:
  - DC ~ 3-6 kW
  - BAIS @ level between 40-80% net D.R.(of unbiased D.R.)

METHOD AND APPARATUS OF DISTRIBUTED PLASMA PROCESSING SYSTEM FOR CONFORMAL ION STIMULATED NANOSCALE DEPOSITION PROCESS

RELATED APPLICATIONS

The present application is a Divisional Application of application Ser. No. 10/854,607, filed on May 26, 2004, which is hereby expressly incorporated by reference herein.

FIELD OF INVENTION

The present invention relates to a method and apparatus for thin film deposition, and more particularly to a method and apparatus for conformal thin film deposition in high aspect ratio features on a substrate.

DESCRIPTION OF RELATED ART

In the metallization of high aspect ratio (HAR) via holes and contacts, as well as trenches, on semiconductor substrates for inter-level and intra-level wiring of integrated circuits (ICs), barrier layers and seed layers are typically deposited that are required to have sufficient sidewall and bottom coverage to produce the desired barrier or seed properties. For example, it is usually desirable to have a barrier layer as thin as possible in order to minimize its electrical resistance; however, it must not sacrifice its barrier properties. Additionally, for example, the barrier layer must be conformal and continuous without voids in order to prevent diffusion of seed layer material into the dielectric layer and other layers in order to prevent reliability problems. A film is conformal when the difference between its maximum and minimum thickness are within some acceptable limit for the process. Conformality is better when the ratio between the maximum and minimum film thicknesses is less.

For the metallization of HAR features, ionized physical vapor deposition (iPVD) has been utilized in semiconductor processing, and it has been considered for extension into submicron technology. Ionized PVD has provided good sidewall and bottom coverage in via and trench structures; however, the deposition requirements become more critical as geometries shrink and as via dimensions fall below approximately 100 nanometers. Even small overhang at the feature orifice (or top) has been identified as a critical deterrent to sufficient feature coverage. Furthermore, the creation of overhang has also been identified to be sensitive to the feature shape, and this effect has an impact on the overall yield of the process.

Generally, a conformal deposition of the thin layers in interconnect fabrication has been very difficult with current conventional processing and, hence, it has yielded very poor step coverage, which is sometimes defined numerically as the ratio of feature sidewall coverage thickness to coverage thickness in the field area or horizontal surface of the substrate below which the feature extends, with a higher ratio, approaching unity, being better. For example, physical vapor deposition (PVD), such as sputtering, of a metal layer (for adhesion, barrier and/or seed layer) requires at least about 5 nm (nanometers) over all surfaces of the trench and/or contact via, thus PVD of metal into high aspect ratio features requires much greater deposition on the top surfaces of the substrate to produce adequate coverage of the via bottom. Typical state-of-the-art trench and contact structures for dual damascene schemes require about 50 nm PVD metal film 21 on the horizontal field area 27 of the substrate 20, as illustrated in FIG. 12A, in order for 5 nm of metal 24 to reach the bottom and sidewalls of a contact via 23. Due to the directionality of PVD techniques, deposition tends to accumulate more rapidly at upper corners 25 of the trench and/or via, as compared to the bottom 26. As a result of the rapid build-up of deposited material on the upper surfaces of the structure, which occupies much of the conductive line width, these built-up corners then cast a shadow into the lower reaches of the feature.

In current IC interconnect technology utilizing iPVD (see Rossnagel, "Directional and iPVD for microelectronics applications", J. Vac. Sci. Technol. B16(5), 2585-2608, 1998), several approaches have included sequential or in-situ deposition and etch processes in order to eliminate the overhang (see U.S. Pat. Nos. 6,100,200, 4,999,096, and 6,274,008, and US Patent Application No. 2003/0034244). However, the inventor has observed that conventional process conditions still result in some undesirable effects, which may include overhang and closure of via, discontinuity of the metal layer, low deposition rate, and throughput limitations. With some approaches, independent deposition and etch systems may be required, which involve substrate transfer issues, contamination can occur due to an unprotected internal coil, and non-uniform plasma generation and consequently non-uniform etching are just a few additional issues facing current practice. Moreover, the inventor has observed that consideration of only the re-sputtering effect at the substrate surface does not completely prevent overhang build-up.

Other techniques used for metallization of vias and trenches include, for example, chemical vapor deposition (CVD) processes developed for certain metals and metal nitrides, which can exhibit improved step coverage than PVD processes, however, even CVD processes tend to deposit far less material at the bottom of a dual damascene contact via than on the upper surfaces and sidewalls of the structure. Thus, while somewhat improved relative to PVD, CVD step coverage of dual damascene structures remains uneven with most currently known low temperature CVD techniques. A more recent method proposed for conformal coverage of metal interconnects includes atomic layer deposition (ALD) (see U.S. Pat. No. 6,699,783). In general, ALD comprises cycles of alternating reactant phases, wherein each phase has a self-limiting effect. However, ALD processes are posed with issues surrounding the availability of precursors at high pressure and at room temperature.

Overall, the inventor has observed that current metallization technology lacks the ability to eliminate feature overhang and, consequently, will ultimately fail to provide sufficient coverage of HAR features for increasingly advanced ICs.

SUMMARY OF THE INVENTION

One object of the present invention is to reduce or eliminate any or all of the above-described problems. Another object of the present invention is to provide a method of depositing a material to improve coverage characteristics within high aspect ratio (HAR) features.

According to principles of the present invention, a deposition system for forming a thin film in a high aspect ratio feature on a substrate is described comprising: a process chamber; a substrate holder coupled to the process chamber, and configured to support the substrate; a plasma source coupled to the process chamber, and configured to form a plasma in the process chamber; and a metal source coupled to the process chamber, and configured to introduce a metal to the process chamber, wherein the plasma source and the metal source are configured to produce a ratio between a metal density and a plasma density of less than unity above the substrate.

According to another aspect of the present invention, a method of depositing a thin metal film in a high aspect ratio feature on a substrate comprising: disposing the substrate on a substrate holder in a deposition system; forming a plasma having a plasma density within the deposition system using a plasma source; introducing metal having a metal density within the deposition system using a metal source; establishing a ratio of the metal density to the plasma density above the substrate, the ratio being approximately equal to or less than unity; and performing a conformal deposition within the feature on the substrate.

While the present invention was primarily directed to the deposition of metal, it is contemplated that it will have application to the deposition of films of other coating materials which behave in such a way as to respond favorably to the principles of the present invention. For example, it is believed that the invention is particularly useful for metal deposition in part where the metals have ionization potentials that are less than that of the background processing gas. Accordingly, a coating material having an ionization potential that is less than the background gas should benefit from application of the principles of the present invention. In cases where the processing gas is, for example, argon, it is expected that a coating material having an ionization potential less than that of argon would particularly benefit from the present invention. Using a background gas having a higher ionization potential should enable extension of the invention to more materials. Extension of the invention to still further materials may be determined analytically or empirically.

DETAILED DESCRIPTION OF PREFERRED EMBODIMENTS

Figure 1:
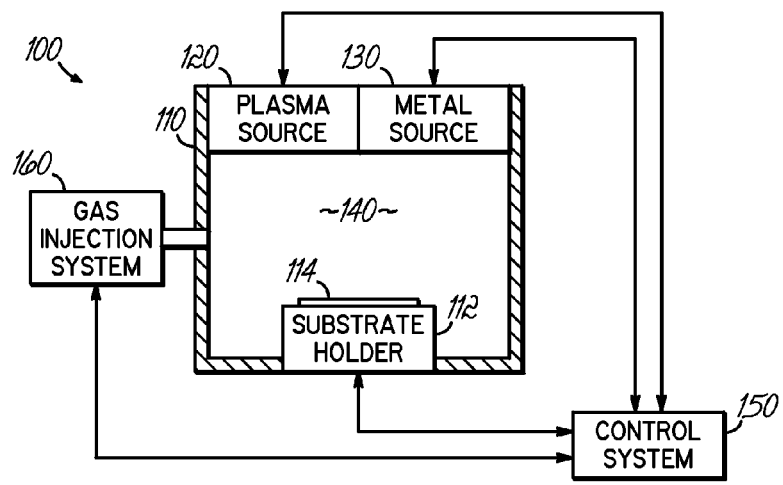
FIG. 1 depicts a schematic view of a deposition system according to an embodiment of the invention.

In the following description, in order to facilitate a thorough understanding of the invention and for purposes of explanation and not limitation, specific details are set forth, such as a particular geometry of the deposition system and various shapes of the plasma source and the distributed metal source. However, it should be understood that the invention may be practiced in other embodiments that depart from these specific details.

Nonetheless, it should be appreciated that, contained within the description are features which, notwithstanding the inventive nature of the general concepts being explained, are of an inventive nature.

For example, inventive aspects of the present disclosure include providing a deposition system and method for forming a thin film in a high aspect ratio feature on a substrate wherein a plasma source is coupled to a process chamber and configured to form a high density plasma of greater than $10^{12}$ e/cm$^3$ (electrons per cubic centimeter) in the process chamber and a metal source coupled to the process chamber and configured to introduce a metal to the process chamber at a total density of metal atoms and metal ions that is less than the plasma density.

As another example, inventive aspects of the present disclosure include providing a deposition system and method for forming a thin film in a high aspect ratio feature on a substrate wherein a plasma source and a metal source are coupled to a process chamber and configured to form a plasma in the process chamber having a metal density that is less than the plasma density across and proximate the substrate surface. As a further example, inventive aspects include providing such a deposition system and method for forming a thin film in a high aspect ratio feature on a substrate wherein a plasma source and a metal source are coupled to a process chamber and configured to form a plasma in the process chamber having a metal density that is less than the plasma density across and proximate the substrate surface wherein the ratio of the total metal density to the plasma density is relatively uniform across the substrate surface.

As a further example that contains features referred to above as well as other inventive aspects, a deposition system and method may be provided for forming a thin film in a high aspect ratio feature on a substrate using a plasma source coupled to a process chamber and configured to form a high density plasma of greater than $10^{12}$ e/cm$^3$ and using a metal source coupled to the process chamber and configured to introduce a metal to the process chamber at a ratio of the total density of metal atoms and metal ions to the plasma density of between 0.1 and 1.0 and is generally uniform across and proximate the substrate surface. As a still further example, additional inventive aspects are included in providing such a deposition system and method for forming a thin film in a high aspect ratio feature on a substrate using a plasma source coupled to a process chamber and configured to form a high density plasma of greater than $10^{12}$ e/cm$^3$ and using a metal source coupled to the process chamber and configured to introduce a metal to the process chamber at a ratio of the total density of metal atoms and metal ions to the plasma density of between 0.1 and 1.0 and is generally uniform across and proximate the substrate surface throughout a volume that extends from the substrate surface toward the plasma and includes either a plasma sheath, the plasma sheath and a near sheath, the plasma sheath and the near sheath and at least some of the plasma inside the near sheath, or a thickness of approximately ¼th the diameter of the substrate.

Other examples are contained throughout the description of the various embodiments below, as well as in the claims as set forth below.

Figure 12A:
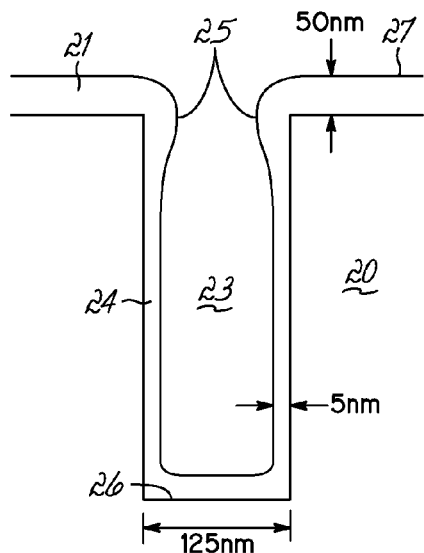
FIG. 12A is a cross-sectional diagram of a contact via having a barrier layer deposited according to methods of the prior art.
Figure 12B:
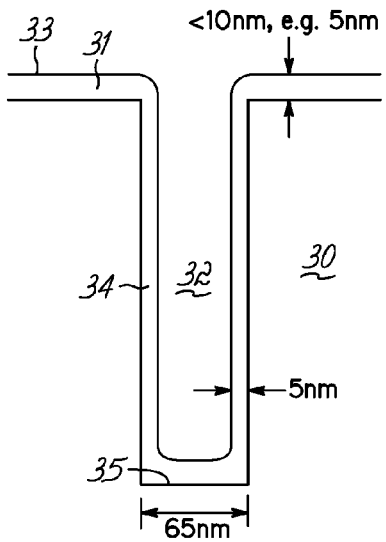
FIG. 12B is a cross-sectional diagram of a contact via having a barrier layer deposited according to some embodiments of a method and apparatus according to the present invention.

An example of advantages realized with certain embodiments of the present invention is illustrated in FIG. 12B, which shows the result of a deposition of a film 31 on a substrate 30 having high aspect ratio (e.g., 7:1) features, such as a 65 nm wide via 32. The film 31 may, for example, have a thickness of 5 nm+/−1.25 nm across the flat field or field area 33 of the substrate and the sidewalls 34 and bottom 35 of the feature 32 on the substrate 30.

In order to improve deposition characteristics particularly in high aspect ratio features, the present invention improves a deposition system and method of operation to affect improvements in chemical transport local to an exposed substrate surface. The exposed substrate surface is exposed to material deposition steps, the combination of which serve to alter the material composition and/or topography of the exposed substrate surface. For example, the deposition system may be said to utilize ion stimulated conformal nanoscale deposition.

According to an embodiment of the invention, a system for conformal deposition of thin films is described. The deposition system provides conditions for highly uniform feature coverage within high aspect ratio (HAR) features. Within the deposition system, a plasma source produces a high density plasma (i.e., where the electron density, $n_e > 10^{12}$ cm$^{-3}$). Additionally, within the deposition system, a metal source produces a metal adatom. The formation of plasma and the generation of metal adatom is performed in such a way to maintain a constant ratio of the metal density (including the density of neutral metal atoms and the density of metal ions) to the plasma density (or electron density, or ion density) of less than or equal to unity (e.g., $n_{metal}/n_e$=const$\leq$1). The inventor has observed that performing the deposition to meet this condition has provided conformal coverage of the flat field surface and feature internal surfaces across the substrate at the same deposition rate. Additionally, the deposition is, for instance, occurring in a surface kinetic mode across the substrate surface, and contributing to enhanced rate at feature sidewalls.

Referring now to FIG. 1, a deposition system 100 is presented according to an embodiment of the invention. Deposition system 100 includes a process chamber 110, and a substrate holder 112 coupled to the process chamber 110, and configured to support a substrate 114. Additionally, the deposition system 100 includes a plasma source 120 coupled to the process chamber 110 and configured to form plasma in process space 140 within process chamber 110. Additionally, the deposition system 100 includes a metal source 130 coupled to the process chamber 110, and configured to introduce a metal adatom to process space 140 in process chamber 110. The deposition system 100 can further comprise a gas injection system 160 coupled to the process chamber 110, and configured to introduce an inert gas, such as a Noble gas, to the process space 140 in process chamber 110. Optionally, the deposition system 100 can further comprise a control system 150 coupled to the process chamber 110, the substrate holder 112, the plasma source 120, and the metal source 130, wherein it may be configured to perform at least one of operating, adjusting, monitoring, or controlling the deposition system 100 according to, for example, a process recipe.

Figure 2:
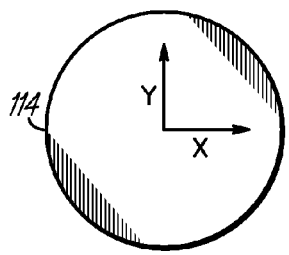
FIG. 2 illustrates a coordinate system parallel to an upper surface of a substrate.

The formation of plasma and the generation of metal adatom is performed in such a way to maintain a ratio of the metal density to the plasma density (or electron density, or ion density) of less than or equal to unity (e.g., $n_{metal}/n_e \leq 1$). The ratio can, for example, be maintained less than or equal to unity for at least one point in space and spaced from the surface of substrate 114. Meeting such a condition will cause a density distribution that will allow realization of at least some of the advantages of the invention. Alternatively, a spatial distribution of this ratio can be maintained less than or equal to unity across the surface of substrate 114. Alternatively, the spatial distribution of this ratio can be maintained less than or equal to unity across the surface of substrate 114, and it can be maintained substantially uniform, or within +/−25%, across the surface of substrate 114. Alternatively, the spatial distribution of this ratio can be maintained less than or equal to unity across the surface of substrate 114, and it can be maintained substantially constant across the upper surface of substrate 114 (e.g., $n_{metal}/n_e \approx$const$\leq$1). For instance, the spatial distribution of the metal adatom density can be represented by the function f(x,y), and the spatial distribution of the plasma density can be represented by the function g(x,y), wherein x and y represent a two-dimensional rectilinear coordinate system parallel to the upper surface of substrate 114 (see FIG. 2). The function f(x,y) can be substantially constant across the upper surface of substrate 114, and the function g(x,y) can be substantially constant across the upper surface of substrate 114, wherein the ratio of f(x,y) to g(x,y) at any point in space (x,y) is less than or equal to unity. Alternatively, the function f(x,y) is not uniform across the upper surface of substrate 114, and the function g(x,y) is not uniform across the upper surface of substrate 114; however, f(x,y) and g(x,y) are similar functions, and the ratio of f(x,y) to g(x,y) at any location in space (x,y) is less than or equal to unity. For example, the similarity of functions can be characterized as the mathematical similarity of the functions f(x,y) and g(x,y) (i.e., shape, curvature, etc.). Alternatively, the ratio can be maintained substantially invariant as a function of time.

Referring still to FIG. 1, plasma source 120 can include an electrode coupled to a power source, such as a radio frequency (RF) generator, or a coil antenna coupled to a power source, such as a helical coil or other antenna coupled to an RF generator. For example, the plasma source 120 can include a capacitively coupled plasma (CCP) source, or an inductively coupled plasma source (ICP), or combination thereof. Additionally, for example, sub- and atmospheric ICP sources generate plasma with electron density of approximately $n_e \approx (1-4) \times 10^{14}$ cm$^{-3}$ and electron temperature of approximately ~0.2 eV to approximately 0.6 eV with 100% ionization of the metal adatom. Alternately, plasma source 120 can include a source capable of production of large area plasmas, such as electron beam sources with low electron temperature and electron density of approximately $n_e \approx 1.2 \times 10^{12}$ cm$^{-3}$ and above, as well as those capable of high density flat plasma production based on surface waves, helicon, or electron cyclotron resonance (ECR) plasma sources.

Metal source 130 can, for example, be distributed about the perimeter of process chamber 110, from which metal adatoms enter process space 140. For example, a metal target may be utilized as a source of metal. The target can be biased using direct current (DC), or alternating current (AC) to generate metal adatoms through a sputtering process. Alternately, other metal sources, such as magnetrons, can be used. For example, pulsed laser deposition, high power pulsed magnetron sputtering, plasma assisted sputter techniques, etc., can be utilized. Additionally, for example, the metal source 130 can include a plurality of metal sources. The plurality of metal sources can be coupled to a power source. Alternately, each metal source can be independently coupled to a separate power source. Alternately, the power can be alternatingly and sequentially coupled to the plurality of metal sources using one or more power sources.

Substrate holder 112 can include an electrode through which AC power, such as RF power, or DC power is coupled to substrate 114. For example, substrate holder 112 can be electrically biased at an RF voltage via the transmission of RF power from an RF generator through an impedance match network to substrate holder 112. The RF bias can serve to heat electrons to form and maintain plasma. Alternatively, the RF bias can serve to affect the ion energy of ions incident on the upper surface of the substrate. A typical frequency for the RF bias can range from 0.1 MHz to 100 MHz. RF systems for plasma processing are well known to those skilled in the art. Alternately, RF power is applied to the substrate holder electrode at multiple frequencies. Furthermore, an impedance match network can serve to improve the transfer of RF power to plasma in the process chamber by reducing the reflected power. Match network topologies (e.g. L-type, π-type, T-type, etc.) and automatic control methods are well known to those skilled in the art.

Additionally, the substrate holder 112 can comprise an electrostatic clamping system (or mechanical clamping system) in order to electrically (or mechanically) clamp substrate 114 to the substrate holder 112. Furthermore, substrate holder 112 can, for example, further include a cooling system having a re-circulating coolant flow that receives heat from substrate holder 112 and transfers heat to a heat exchanger system (not shown), or when heating, transfers heat from the heat exchanger system. Moreover, a heat transfer gas can, for example, be delivered to the back-side of substrate 114 via a backside gas system to improve the gas-gap thermal conductance between substrate 114 and substrate holder 112. For instance, the heat transfer gas supplied to the back-side of substrate 112 can comprise an inert gas such as helium, argon, xenon, krypton, a process gas, or other gas such as oxygen, nitrogen, or hydrogen. Such a system can be utilized when temperature control of the substrate is required at elevated or reduced temperatures. For example, the backside gas system can comprise a multi-zone gas distribution system such as a two-zone (center-edge) system, wherein the back-side gas gap pressure can be independently varied between the center and the edge of substrate 114. In other embodiments, heating/cooling elements, such as resistive heating elements, or thermoelectric heaters/coolers can be included in the substrate holder 112, as well as the chamber wall of the process chamber 110.

Furthermore, control system 150 can include a microprocessor, memory, and a digital I/O port capable of generating control voltages sufficient to communicate and activate inputs to deposition system 100 as well as monitor outputs from deposition system 100. Moreover, control system 150 can be coupled to and can exchange information with process chamber 110, plasma source 120, distributed metal source 130, gas injection system 160, and vacuum pump system (not shown). For example, a program stored in the memory can be utilized to activate the inputs to the aforementioned components of deposition system 100 according to a process recipe in order to perform a deposition process. One example of control system 150 includes a DELL PRECISION WORKSTATION 610™, available from Dell Corporation, Austin, Tex.

Figure 3A:
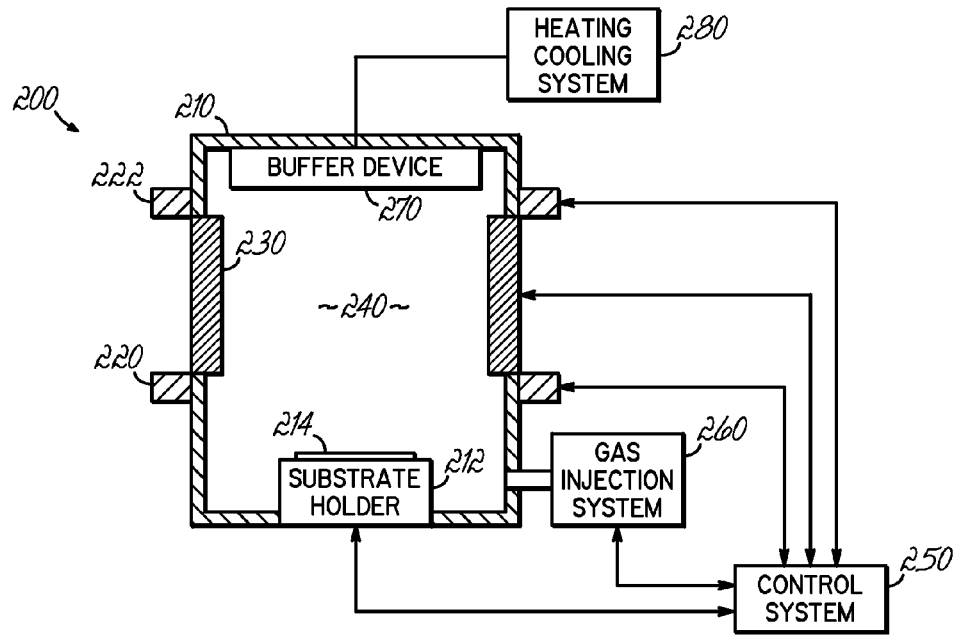
FIG. 3A depicts a schematic view of a deposition system according to another embodiment of the invention.
Figure 3B:
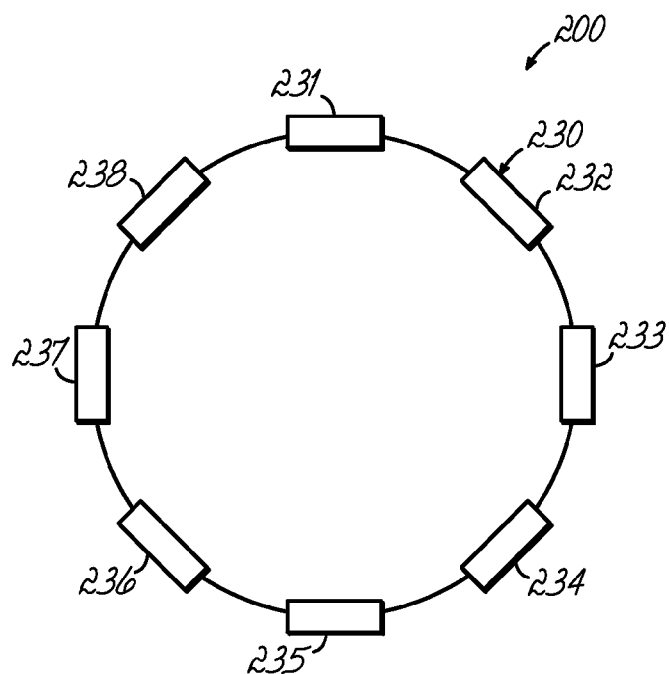
FIG. 3B illustrates a top view of the deposition system depicted in FIG. 3A.

Referring now to FIGS. 3A and 3B, another deposition system 200 is presented according to an embodiment of the present invention. Deposition system 200 includes similar elements as the deposition system 100 described in FIG. 1. However, deposition system 200 includes two or more plasma sources provided at two or more locations in order to provide uniform and controllable plasma density distribution sufficient to uniformly ionize metal adatoms. For example, deposition system 200 includes a first plasma source 220 coupled to and surrounding a lower portion of the process chamber 210 and configured to form plasma in process space 240, and a second plasma source 222 coupled to and surrounding an upper portion of the process chamber 210 and configured to form plasma in process space 240.

Additionally, the deposition system 200 includes a distributed metal source 230 coupled to the process chamber 210, and configured to introduce a metal adatom to process space 240 in process chamber 210. The position of the distributed metal source 230 can be as indicated in FIG. 3A and FIG. 3B.

As shown in FIG. 3A, deposition system 200 can further comprise a buffer device 270. For example, a portion of the process chamber 210 does not contain either a distributed metal source, or a plasma source, but rather it constitutes a buffer surface to compensate for the different processing rates at the substrate. The buffer surface 270 can include at least one of a convex, planar or concave shape, and it may be fabricated of conductive material, such as aluminum, stainless steel, etc. The purpose of the buffer device 270 can, for example, be to complement the radial distribution of metal adatom in process space 240. Since the surface reactions are sensitive to the surface temperature, the buffer surface (buffer device 270) can contain temperature control elements, such as cooling and/or heating devices, in order to control its surface temperature. Additionally, for example, the buffer device 270 can be connected to a DC, or AC power supply. Additionally, the buffer device 270 can contain a magnetic field structure that generates static, or dynamic magnetic field by means of permanent magnets, or electromagnets. Additionally, the buffer device 270 can be translatable. For example, the buffer device 270 can translate in a direction perpendicular to the substrate 214 in order to alter the spacing between the buffer device 270 and substrate 214.

The deposition system 200 can further comprise a gas injection system 260 coupled to the process chamber 210, and configured to introduce an inert gas, such as a Noble gas, to the process space 240 in process chamber 210. Optionally, the deposition system 200 can further comprise a controller 250 coupled to the process chamber 210, the substrate holder 212, first plasma source 220, second plasma source 222, and the distributed metal source 230, wherein it may be configured to perform at least one of operate, adjust, monitor, or control the deposition system 200 according to, for example, a process recipe.

Figure 4:
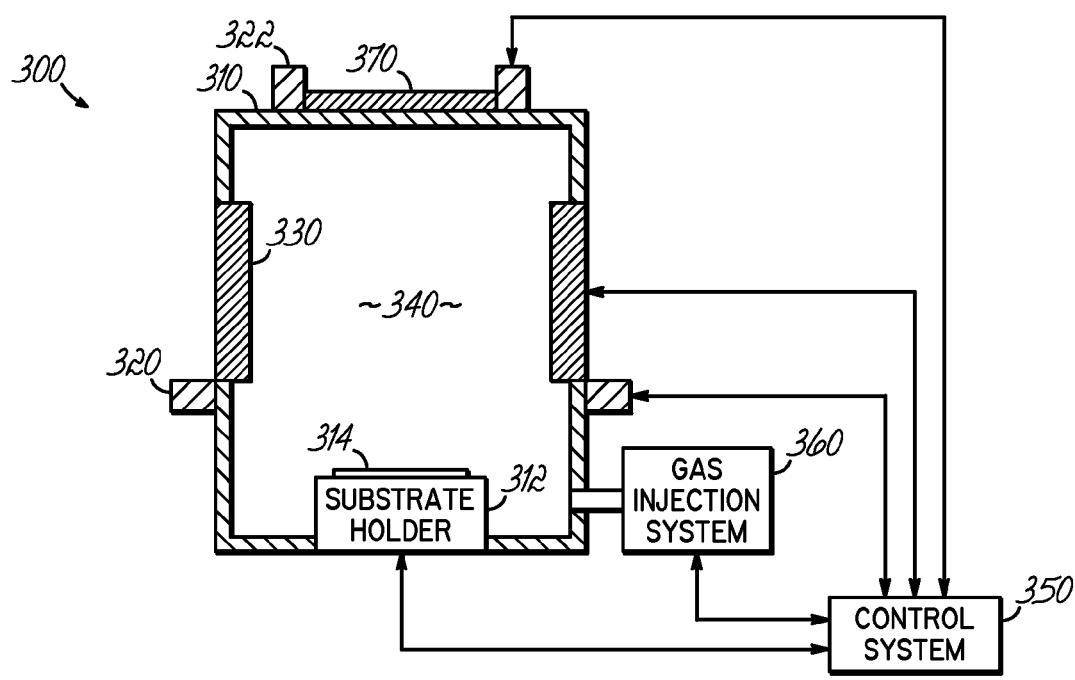
FIG. 4 depicts a schematic view of a deposition system according to another embodiment of the invention.

Referring now to FIG. 4, another deposition system 300 is shown corresponding to yet another embodiment of the invention. The deposition system 300 includes two or more plasma sources provided at two or more locations in order to provide uniform and controllable plasma density distribution sufficient to uniformly ionize metal adatoms. For example, deposition system 300 includes a first plasma source 320 coupled to and surrounding a lower portion of the process chamber 310 and configured to form plasma in process space 340, and a second plasma source 322 coupled to and located above the process chamber 310 and configured to form plasma in process space 340. Additionally, the deposition system 300 includes a distributed metal source 330 coupled to the process chamber 310, and configured to introduce a metal adatom to process space 340 in process chamber 310. The deposition system 300 can further comprise a gas injection system 360 coupled to the process chamber 310, and configured to introduce an inert gas, such as a Noble gas, to the process space 340 in process chamber 310. Optionally, the deposition system 300 can further comprise a control system 350 coupled to the process chamber 310, the substrate holder 312, the plasma sources 320 and 322, and the distributed metal source 330, wherein it may be configured to perform at least one of operating, adjusting, monitoring, or controlling the deposition system 300 according to, for example, a process recipe. Deposition system 300 can further comprise a buffer device 370 as described above.

Figure 5:
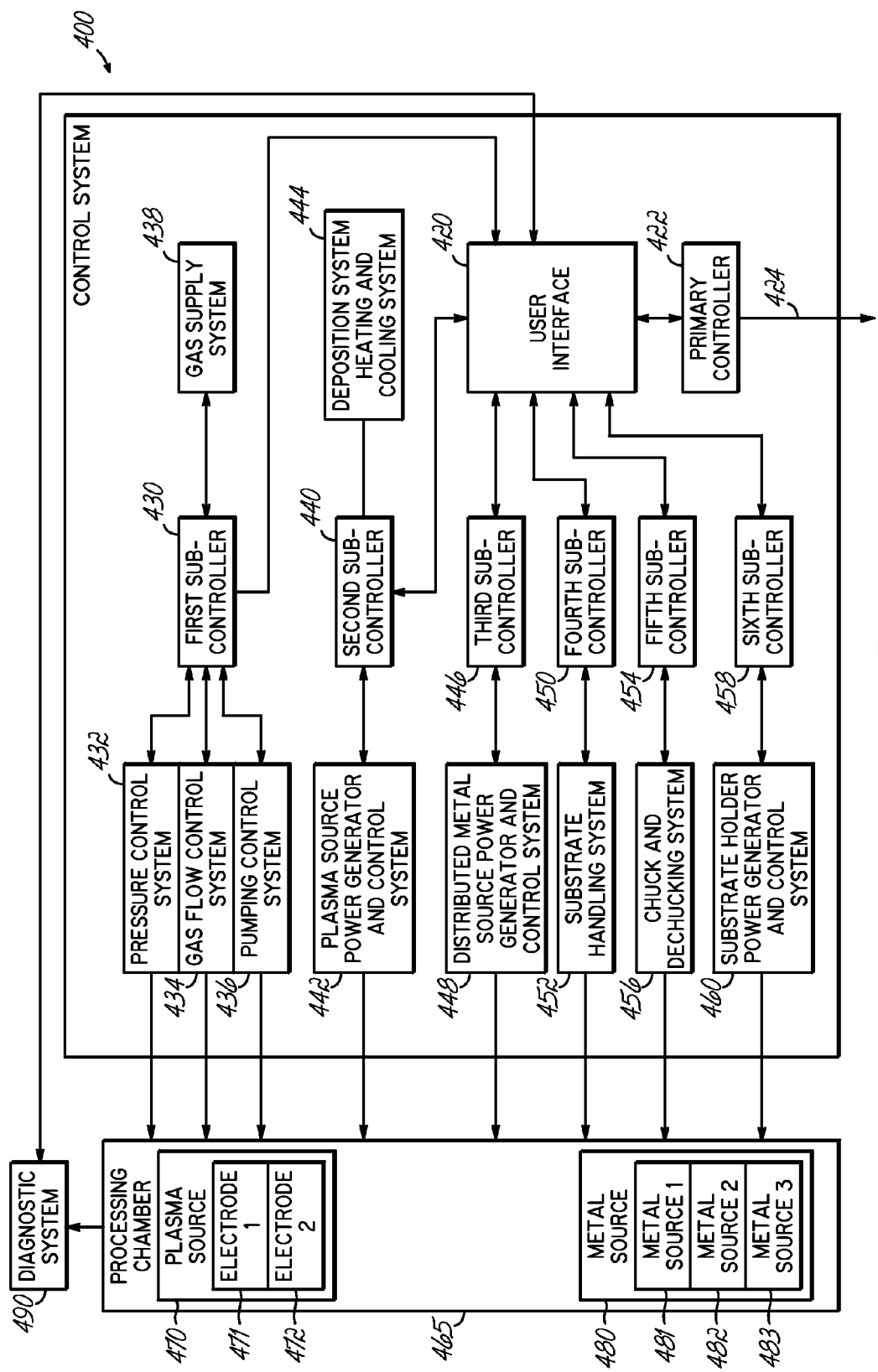
FIG. 5 depicts a schematic view of a deposition system according to another embodiment of the invention.

Additionally, for example, FIG. 5 illustrates a layout for a deposition system 400 having a control system 410 for controlling deposition system 400. The control system 410 includes a user interface 420 for setting process parameters and hardware parameters, and a primary controller 422 configured to operate the deposition system according to the set parameters. Control system 410 further includes a first sub-controller 430 configured to operate a pressure control system 432, a gas flow control system 434 and a gas supply system 438, and a pumping system 436. Additionally, control system 410 includes a second sub-controller 440 configured to operate a plasma source power generator and control system 442 and a deposition system cooling and heating system 444, as well as a third sub-controller 446 configured to operate a distributed metal source DC power generator and control system 448. The plasma source power generator and control system 442 and the distributed metal source DC power generator and control system 448 are coupled to the process chamber 465, and configured to operate a plasma source 470 having one or more plasma generating elements 471, 472 and a distributed metal source 480 having one or more metal sources 481, 482, 483, respectively. A fourth sub-controller 450 is configured to operate a substrate handling system 452, a fifth sub-controller 454 is configured to operate a chuck and de-chucking system 456, and a sixth sub-controller 458 is configured to operate a substrate holder power generator and control system 460. Furthermore, a diagnostic system 490 having one or more sensors and instrumentation can be coupled to the process chamber 465, the plasma source 470, and the distributed metal source 480, and configured to provide operational data to the user interface 420.

As illustrated in FIG. 5, the primary controller 422 can be locally located relative to the deposition system 400, or it can be remotely located relative to the deposition system 400. For example, controller 422 can exchange data with deposition system 400 using at least one of a direct connection, an intranet, and the internet. Controller 422 can be coupled to an intranet at, for example, a customer site (i.e., a device maker, etc.), or it can be coupled to an intranet at, for example, a vendor site (i.e., an equipment manufacturer). Additionally, for example, controller 422 can be coupled to the internet. Furthermore, another computer (i.e., controller, server, etc.) can, for example, access controller 422 to exchange data via at least one of a direct connection, an intranet, and the internet.

In the deposition systems described in FIGS. 1 through 5, the distributed metal source can produce metal vapor flux from targets that is thermalized at a gas pressure which is higher than a typical sputtering pressure (typically >30 mTorr). A particularly inventive embodiment of the invention employs the metal to plasma ratio in ion stimulated nanoscale deposition that uses a thermalized plasma or metal vapor in the vacuum processing chamber. The suitable ICP source produces a high density plasma and effective ionization of the metal in bulk volume. Metal ions diffuse towards the substrate surface and are accelerated by a voltage gradient in the pre-sheath and sheath (potential difference between plasma potential and wafer potential). Surface coverage can occur in the surface kinetic mode at high metal ion flux fraction but relatively low total metal density. Due to surface collisions at the flat field, recombined metal ions are returned back to the bulk plasma. Within the feature, the sidewalls provide a capturing effect for metal that escapes the bottom of the feature due to Penning excitation of the background gas, such as argon, and charge exchange of metal ions with the background gas. At these conditions, the ion based deposition rate from the bulk plasma is larger than the generation rate of neutrals at the bottom of the feature, and the generation rate of neutrals is larger than the deposition rate by neutrals from bulk plasma; i.e., conformality is larger than $C^{B/FF} \geq 1$ (B=feature bottom, FF=flat field; i.e., $C^{B/FF}$ represents the ratio of the deposition rate at the feature bottom to the deposition rate at the flat field). When the reflected and re-sputtered metal from the bottom is less than the amount of the metal consumed at the walls through surface reactions, then $C^{SW/B} \geq 1$ (SW=feature sidewall).

Figure 6:
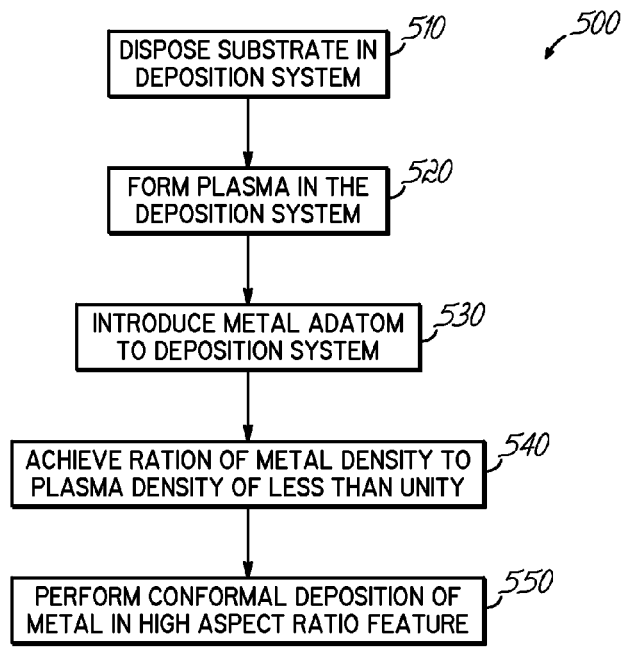
FIG. 6 presents a method for performing conformal deposition of metal in a high aspect ratio feature according to an embodiment of the invention.

Referring now to FIG. 6, a method of depositing a thin film in a high aspect ratio feature is described. The method includes a flow chart 500 beginning in 510 with disposing a substrate in a deposition system. For example, the deposition system can include any one of the depositions systems described above in FIGS. 1 through 5.

In 520, a plasma is formed in the deposition system using one or more plasma sources. The plasma can be formed by introducing a background gas, such as an inert gas, and by coupling power, sufficient for ionization, to the gas.

In 530, a metal is introduced to the deposition system from one or more metal sources.

In 540, a process is established for depositing the metal on the substrate, wherein the ratio of the metal density to the plasma density is substantially equal to unity or less than unity. For example, the process conditions for achieving this ratio are described in greater detail below.

In 550, a conformal deposition of metal on the substrate is performed utilizing the process conditions formed in the deposition system.

In one example, a method to identify the bounds of a process, or process window, for achieving conformal coverage, or more specifically a specific metal-to-plasma density ratio and a distribution thereof, can be borne from first principles simulation, or experimentation, or both. As described above, a metal film is deposited on a substrate, wherein a metal vapor, such as copper, aluminum, tantalum, titanium, etc., is formed in the presence of a background gas, such as a Noble gas, during which multiple collisions create an energetically multi-component plasma environment through elementary reactions. In a metal-gas plasma, such as a metal-argon plasma, five atomic components can be present that comprise a different energetic status and behave differently. For example, the principal collisions that produce these particles are:

Electron collisions with parent gas atoms in bulk plasma:

$$Ar(g) + e^- \rightarrow Ar^*(g) e^- \quad (1) \text{ (electron impact excitation)}$$

$$Ar(g) + e^- \rightarrow Ar^+(g) + 2e^- \quad (2) \text{ (electron impact ionization)}$$

Electron collisions with metal atoms in bulk plasma:

$$M(g) + e^- \rightarrow M^*(g) + e^- \quad (3) \text{ (electron impact excitation)}$$

$$M(g) + e^- \rightarrow M^+(g) + 2e^- \quad (4) \text{ (electron impact ionization)}$$

Metal collisions with parent gas atoms in bulk plasma:

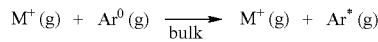

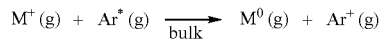

In a low density plasma ($n_e < 10^{10}$ cm$^{-3}$), Penning ionization (see equation 7) is responsible for the majority of metal-ionizing collisions. In a high density plasma ($n_e > 10^{11}$ cm$^{-3}$), the principal metal ionization channel is electron impact ionization (see equation 4). The principal loss channel for charged particles in the bulk plasma is ambipolar diffusion towards the walls and consequent recombination at the wall surface. Ionized metal constitutes a certain fraction of the overall ion density in the argon plasma. When the metal vapor density is comparable to the parent argon density, the fraction is determined by the electron temperature and ionization potentials of both components (e.g., $E_i(Cu) \approx 7.724$ eV, $E_i(Ar) \approx 15.755$ eV). Since the ionization potential for the metal is less than argon at a given electron temperature (other practical metals for interconnects have a comparable ionization potential to copper, e.g., $E_i(Ta) \approx 7.88$ eV, $E_i(Al) \approx 5.984$ eV, $E_i(Ti) \approx 6.82$ eV, etc.) for metal densities $n_M < n_e$, a larger fraction of metal can be ionized than for $n_M > n_e$.

Figure 7:
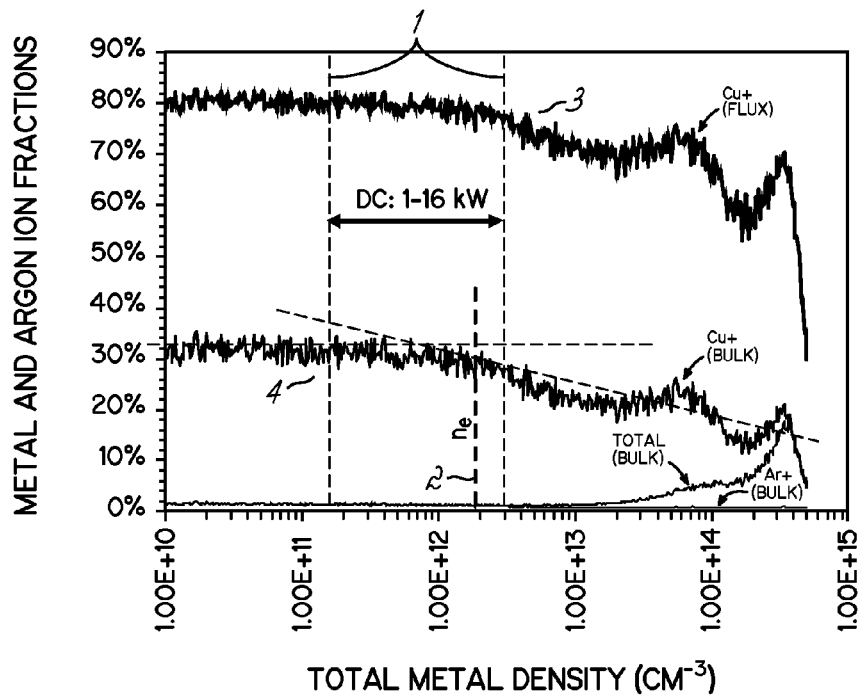
FIG. 7 presents an exemplary ionization fraction of metal and background gas ions in a high density plasma.

For example, FIG. 7 presents results from a global kinetic model for a copper-argon plasma. For example, the results presented in FIG. 7 reflect the ionization fraction of metal and argon ions in the bulk high density plasma (p~65 mTorr, $n_e$~$1.6 \times 10^{12}$ cm$^{-3}$, $T_e$~1.75 eV) and the metal ion flux fraction to the surface for the bulk metal density at the floating substrate. The dashed lines (1) show a reduction in metal (Cu) ion density when exceeding plasma density (2). The model output is based on kinetic processes described above (relations (1) to (7)), and experimental data on plasma density and electron temperature measurements. In order to convert the metal ion density to metal ion flux at a surface, the acceleration of ions to the Bohm velocity by the plasma pre-sheath and the sheath potential difference $V_{plasma} - V_{bias}$ is considered. For example, an increase in the bias can increase the metal ion flux to the surface. The flux of the neutral metal is not affected by the accelerating voltage gradient. This result causes the fraction of ionized metal flux to a substrate (3) to be larger than the fraction of ionized metal (4) in the plasma.

Figure 8A:
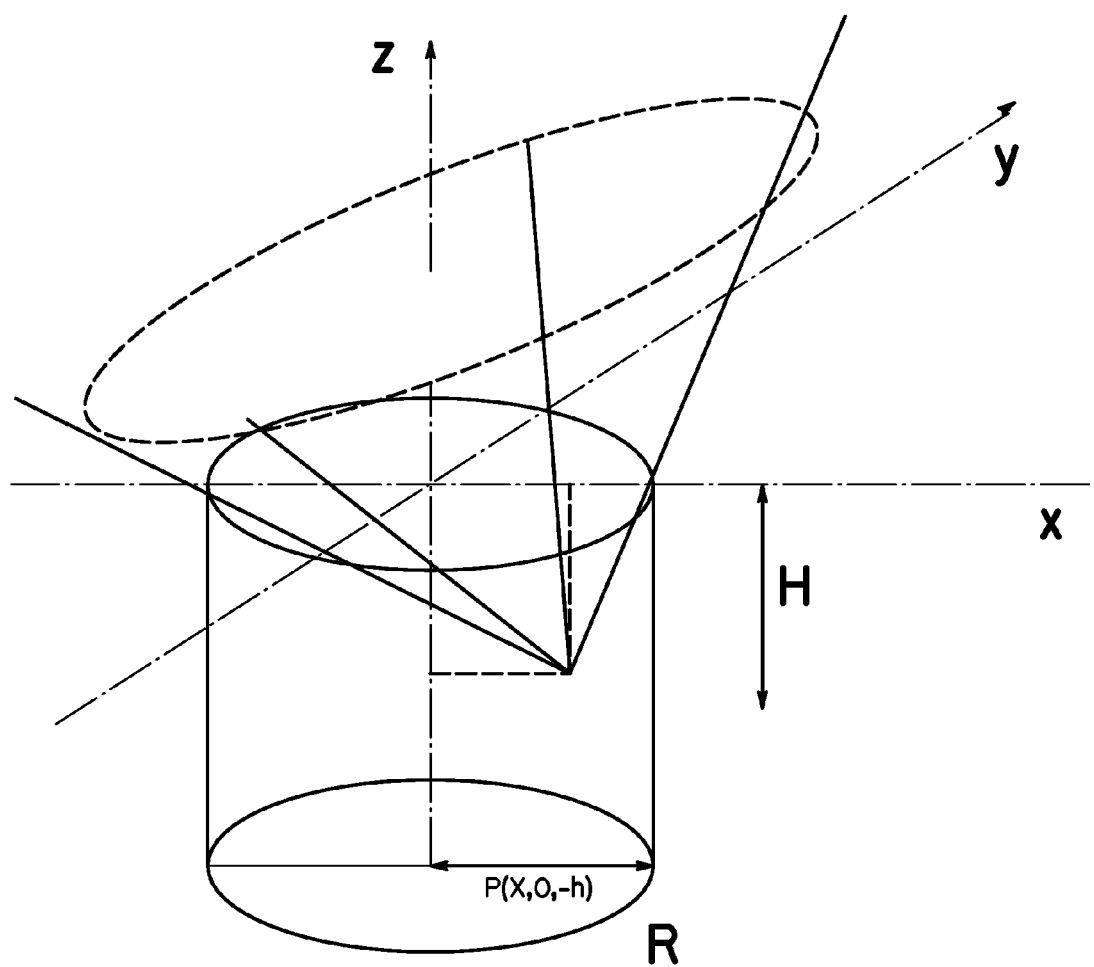
FIG. 8A illustrates an aspect angle from an internal point of a feature.
Figure 8B:
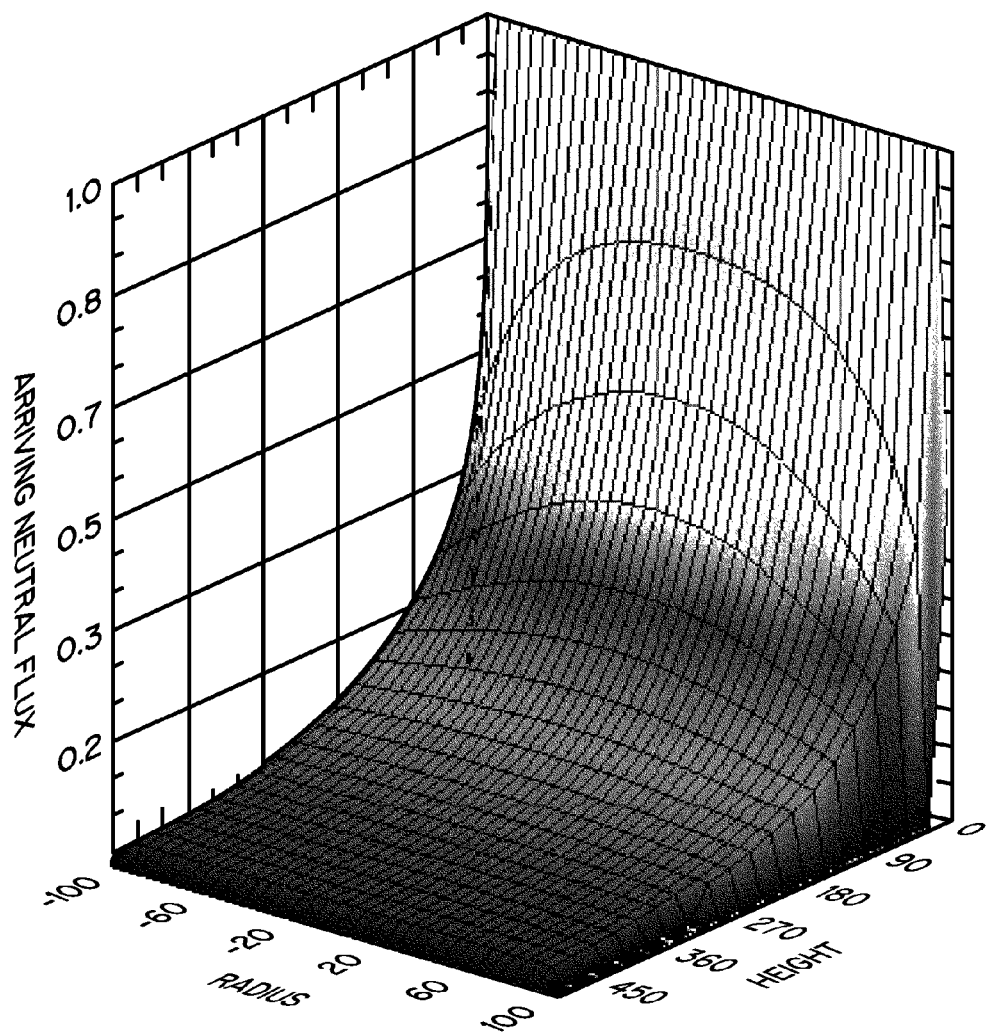
FIG. 8B presents an exemplary surface plot of a normalized neutral flux of metal inside a three-dimensional feature with an aspect ratio of 2.25.
Figure 8C:
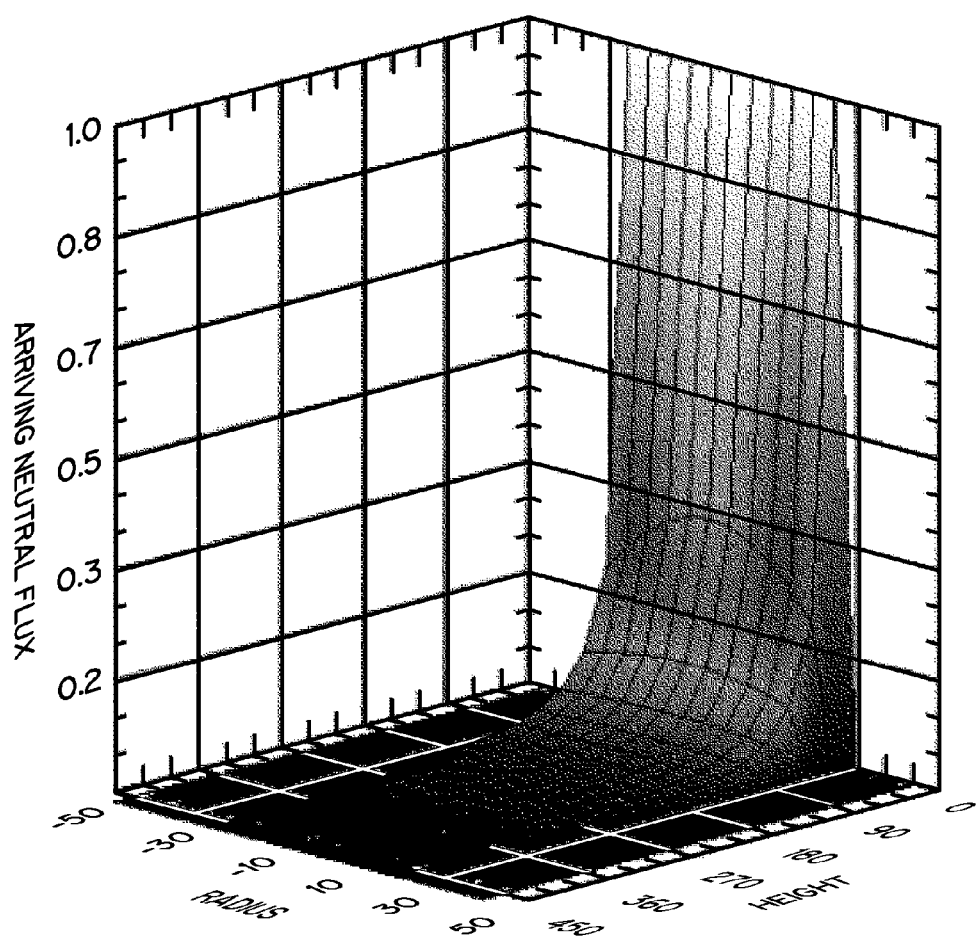
FIG. 8C presents an exemplary surface plot of a normalized neutral flux of metal inside a three-dimensional feature with an aspect ratio of 8.

The metal deposition occurs within a plasma sheath at the substrate surface (or any other surfaces), in which depletion of an electron density occurs ($n_e \rightarrow 0$). Additionally, no electron impact collisions occur within the sheath since, for example, at pressures of 30 to 100 mTorr, an ion-neutral mean free path (1-3 mm) is greater than the sheath width ($<L_{i-n}> \geq 1$ mm $>> d_{sheath} \approx$ 30-100 μm), and thus the sheath can be considered collisionless. Moreover, the neutral flux within a feature is significantly diminished due to the very low aspect angle from a point at the feature surface (see FIG. 8). Under these conditions, the ion stimulated collisions at the surface can play an important role in the metal transport. The presence of the surface plays the role of the third body in collisions and provides advantageous conditions for energy transfer between colliding particles at the surface. In the kinetic model, it is assumed that the following surface collisions can contribute to the deposition rate:

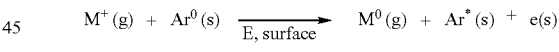

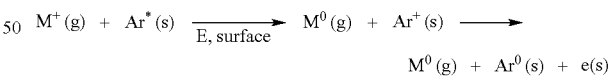

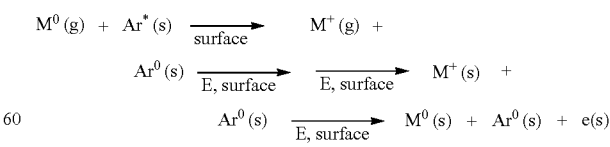

Further, the direct deposition of the neutral metal atoms, the accelerated metal ions, the reflected metal ions from the surface, and the re-sputtering of the substrate surface is also considered.

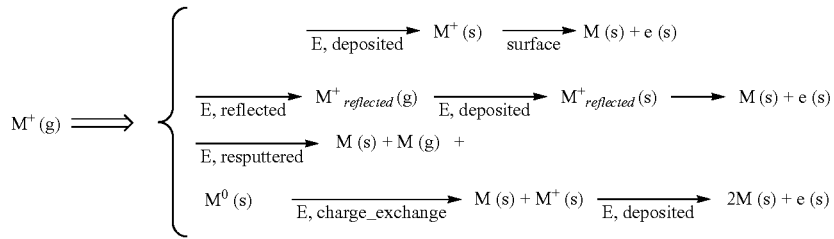

Figure 9A:
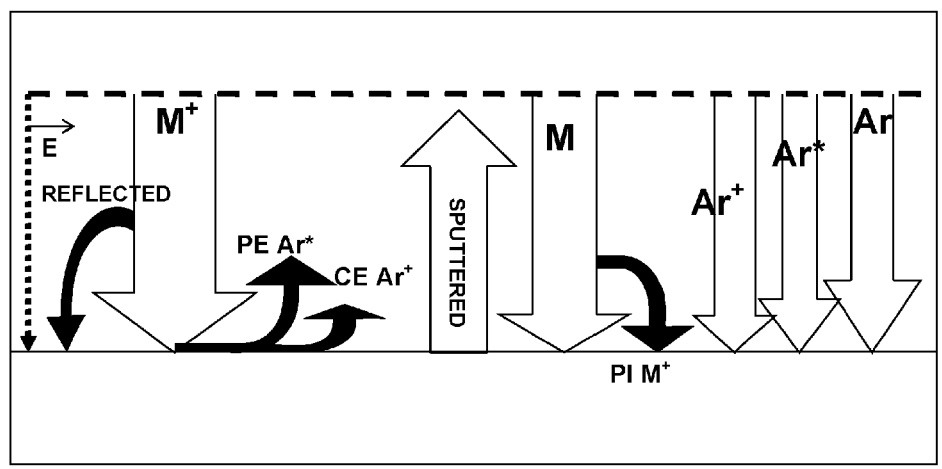
FIG. 9A provides a schematic illustration of the deposition mechanisms and processes contributing to the deposition rate and coverage in ion stimulated nanoscale deposition within the flat field.
Figure 9B:
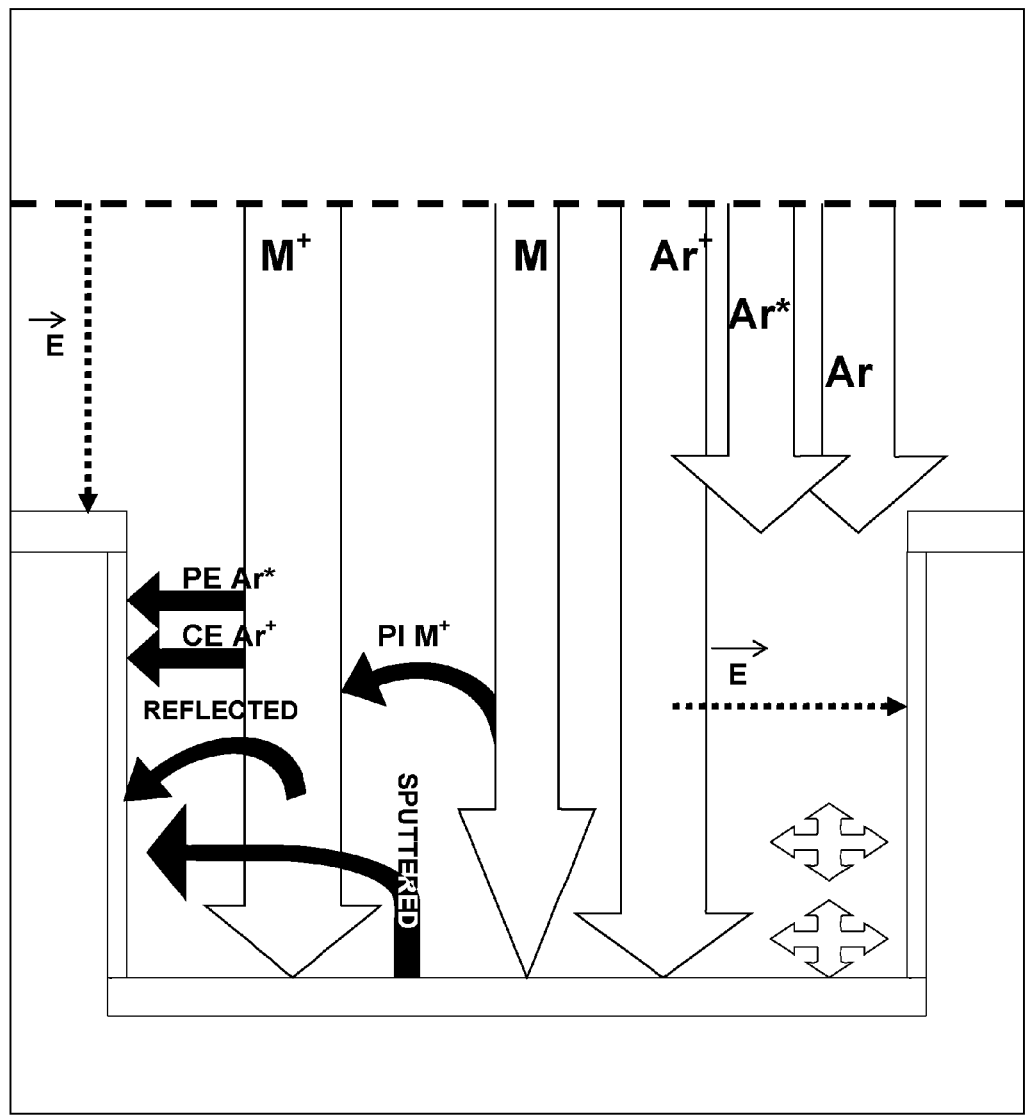
FIG. 9B provides a schematic illustration of the deposition mechanisms and processes contributing to the deposition rate and coverage in ion stimulated nanoscale deposition within the feature.

The overall mechanisms considered in the kinetic model are shown schematically in FIGS. 9A and 9B. Solutions to the kinetic model provide the deposition rate on the flat field surface (D.R.$^{FF}$), the bottom (D.R.$^B$), and the sidewall (D.R.$^{SW}$) surface in terms of metal density ($n_M$), plasma density ($n_e$) and particular rate constants of the described above surface collisions:

$$D.R.^{FF}(n_e, n_M) \approx B_1 n_M + K_1 n_e n_M - Y(\phi, E) n_e + B_3 n_e n_M n_{Ar} - K_2 n_e n_M n_{Ar} - K_3 n_e^2 n_M n_{Ar} \quad (12)$$

$$D.R.^B(n_e, n_M) \approx \Theta(H) B_1 n_M + K_1 n_e n_M [1 - R(\phi_B)] - Y(\phi, E) n_e + \Theta(H)^2 B_3 n_e n_M n_{Ar} - \Theta(H) K_2 n_e n_M n_{Ar} \Theta(H) K_3 n_e^2 n_M n_{Ar} \quad (13)$$

$$D.R.^{SW}(n_e, n_M) \approx \Theta(z) B_1 n_M + \left(1 + \frac{R(\varphi_B)}{4A_R}\right) K_1 n_e n_M + \frac{1}{4A_R} Y(\varphi_B, E) n_e + \left(1 + \frac{1}{4A_R}\right) \Theta(z)^2 B_3 n_e n_M n_{Ar} + \frac{1}{4A_R} \Theta(z) K_2 n_e n_M n_{Ar} + \frac{1}{4A_R} \Theta(z) K_3 n_e^2 n_M n_{Ar} \quad (14)$$

Where the first term on the right hand side (having $B_1$) describes the deposition rate due to neutral metal, the second term (having $K_1$) describes the deposition rate due to ionized metal, the third term (having $Y(\phi,E)$) describes the deposition rate due to the resputtering rate, the fourth term (having $B_3$) describes the deposition rate due to Penning ionization of metal, the fifth term (having $K_2$) describes the Penning excitation of argon, the sixth term (having $K_3$) describes charge exchange between metal and argon, $R(\phi_B)$ represents the reflection coefficient, $n_{Ar}$ represents the background gas bulk density, $\Theta(H)$ represents the neutral flux fraction at the bottom of the feature, $\Theta(z)$ represents the neutral flux fraction at the sidewall of the via, and $A_R$ is aspect ration of the feature.

Additionally, the principal metal transport inside a feature is in molecular regime with high surface collision frequency. At exploited conditions, the surface collision frequency is comparable to the bulk plasma collision frequency. Furthermore, the direct deposition of the neutral metal inside a feature can depend on the position inside the feature.

Analysis of the bottom to flat field coverage $C^{B/FF} = D^B(n_e, n_M)/D^{FF}(n_e, n_M)$, and sidewall to bottom coverage $C^{SW/B} = D^{SW}(n_e, n_M)/D^B(n_e, n_M)$ are shown in Table 1 and Table 2. At reduced metal density $n_M < n_e$, surface reactions predict conformal coverage of the feature $C^{SW/B}(n_e, n_M) \approx 1$, without overhang build-up. Conformal coverage can be achieved when the metal density $n_M$ satisfies the condition $$n_M^{critical} < n_M < n_e,$$

and the plasma density $n_e$ satisfies the relation $n_{e(1)} \leq n_e \leq n_{e(2)}$. Here, $$n_M^{critical}$$

($U_b$, $n_e$, $n_{Ar}$, $B_1$, $B_3$, $K_1$, $K_2$, $K_3$, $R(\phi_B)$) is a complex function of the surface rate constants, reflection coefficient, plasma density, and argon background pressure, and it can be dependent on the physical properties of the actual metal deposited. Specifically, it can be sensitive to process parameters such as the bias at the substrate, and as a result it causes $$n_M^{critical} \to n_e.$$

Plasma density can be determined by similar parameters in a complex way including the aspect ratio of the feature as a parameter. The most important conclusion of the model is that there exist intervals, or process windows, for metal density and plasma density where $C^{B/FF} \approx 1$ and $C^{SW/B} \approx 1$.

From the process point of view based on metal fractions in plasma and applied bias voltage to the substrate, several process windows can be identified for conformal coverage of the high aspect ratio features (see FIGS. 10A through 10H). For example, FIGS. 10A through 10H present the feature sidewall to bottom coverage (kinetic model without surface collisions is illustrated, kinetic model with surface collisions is also illustrated), and the feature bottom to flat field coverage (kinetic model without surface collisions is illustrated, kinetic model with surface collisions is also illustrated) for different process parameters, namely: (10A) No substrate bias, and low metal density; (10B) Substrate bias corresponds to 5% re-sputtering rate and low metal density; (10C) Substrate bias corresponds to 10% re-sputtering rate (relative to the deposition rate) and low metal density; (10D) Substrate bias corresponds to 15% re-sputtering rate and low metal density; (10E) Substrate bias corresponds to 25% re-sputtering rate and metal density is comparable to plasma density; (10F) Substrate bias corresponds to 50% re-sputtering rate and metal density is comparable to plasma density; (10G) Substrate bias corresponds to 75% re-sputtering rate and metal density is comparable to plasma density; and (10H) Substrate bias corresponds to 100% re-sputtering rate and metal density is comparable to plasma density.

Figure 10A:
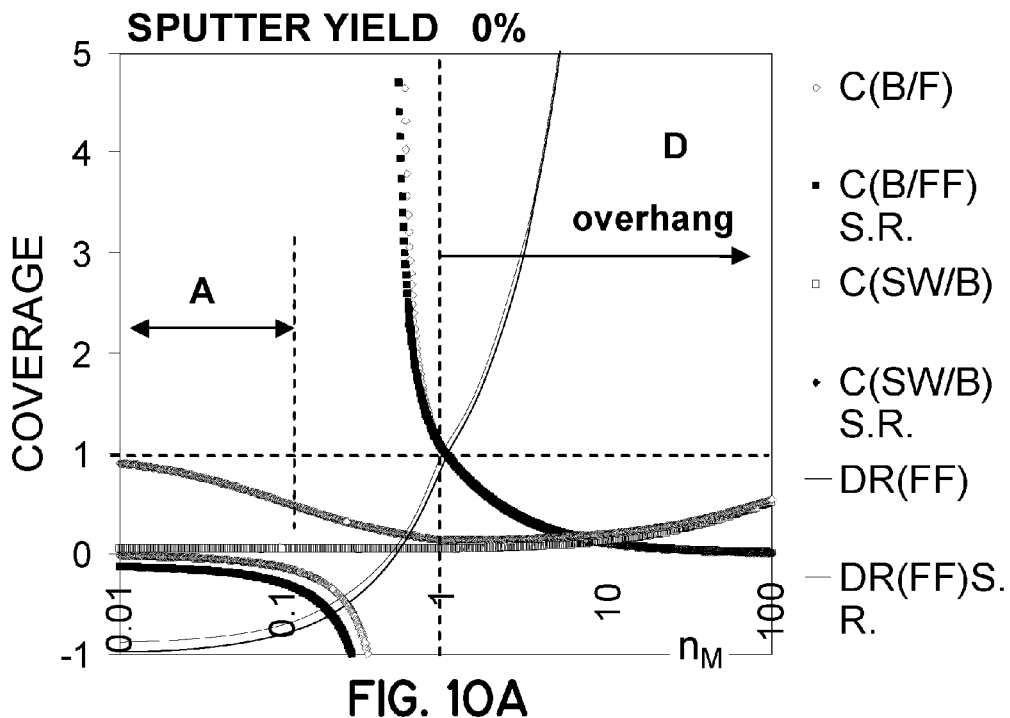
FIG. 10A presents the feature sidewall to bottom coverage and the feature bottom to flat field coverage for a first process condition.
Figure 10B:
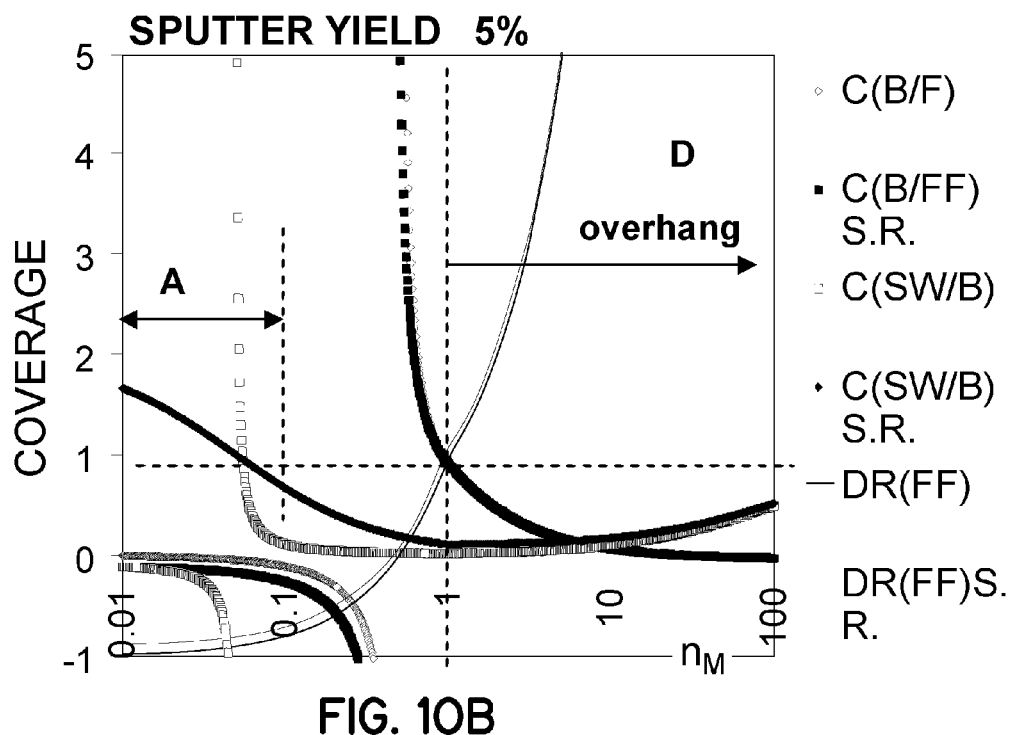
FIG. 10B presents the feature sidewall to bottom coverage and the feature bottom to flat field coverage for a second process condition.
Figure 10C:
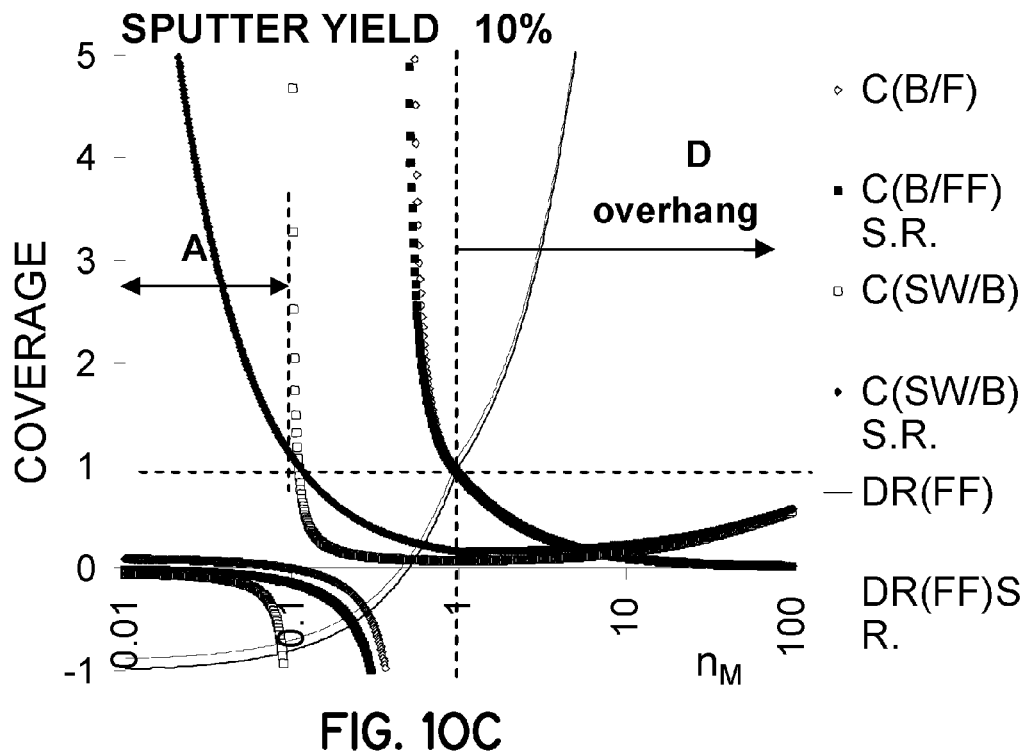
FIG. 10C presents the feature sidewall to bottom coverage and the feature bottom to flat field coverage for a third process condition.
Figure 10D:
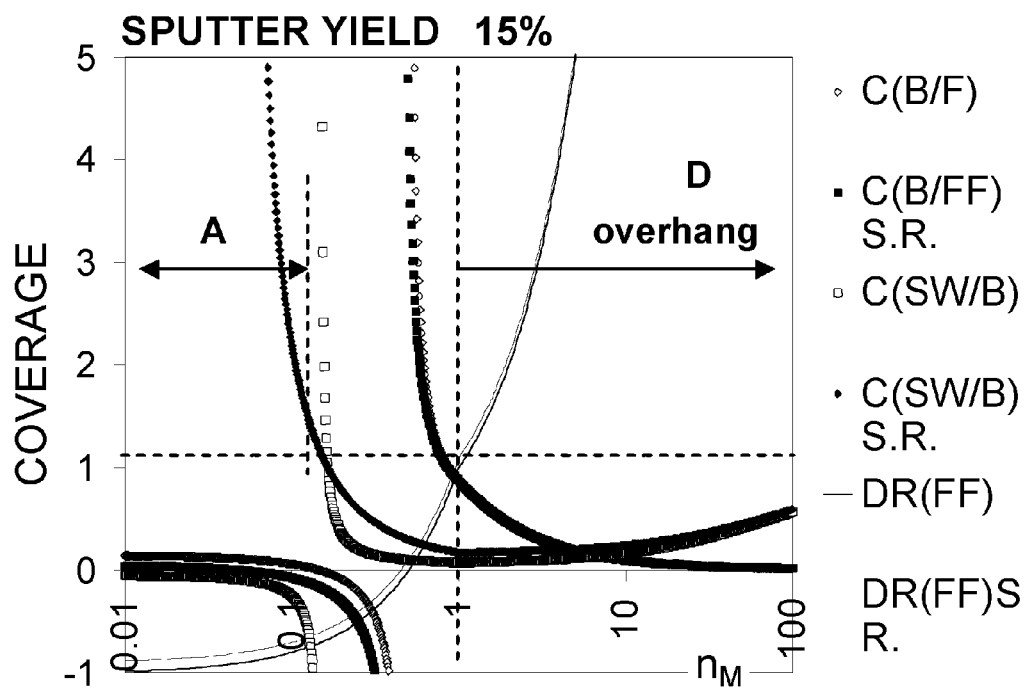
FIG. 10D presents the feature sidewall to bottom coverage and the feature bottom to flat field coverage for a fourth process condition.

According to one embodiment, the process window for conformal coverage includes low bias power (to the substrate), and $n_M < 0.1\, n_e$, or preferably $n_M \leq n_{M,critical} < n_e$ (illustrated in FIGS. 10A, B, C, D at various bias conditions). In this process window, $C^{SW/B} \to 1$, and even when $C^{SW/B} \geq 1$, a moderate increase in the bias power (increase in re-sputtering rate) can increase the sidewall to bottom coverage from conformal to overconformal. Overall, the deposition rate is relatively low, and it can be increased by increasing the plasma density in the bulk plasma, i.e., $n_e \to 10^{13}$ cm$^{-3}$ and above. The bottom to flat field coverage is low $C^{B/FF} < 0.2$, and no overhang is produced.

TABLE 1

COVERAGE BOTTOM/FLAT FIELD

| | | NO SURFACE REACTIONS | | SURFACE REACTIONS | |
|---|---|---|---|---|---|
| LOW | C = 0 | direct ion flux is balanced with resputtering rate (OVERHANG) | $n_M \approx \dfrac{Y(\varphi, E)n_e}{K_1 n_e(1 - R(\varphi))}$ | direct ion flux is balanced with resputtering rate (OVERHANG) | $n_M \approx \dfrac{Y(\varphi, E)n_e}{K_1 n_e(1 - R(\varphi))}$ |
| CONFORMAL | C = 1 | does not have physical solution (OVERHANG) | $n_m = 0\ n_e = 0$ $R(\phi) = 0$ | metal due to arriving neutrals, Penning ionization and reflected ion flux is balanced by Penning excitation and charge exchange fluxes (OVERHANG) | Condition is satisfied independently on metal density |
| | | arriving ion flux must be much larger than resputtering rate (OVERHANG) | $n_M \gg \dfrac{Y(\varphi, E)}{K_1(1 - R(\varphi))}$ | arriving ion flux must be much larger than resputtering rate (OVERHANG) | $n_M \gg \dfrac{Y(\varphi, E)}{K_1(1 - R(\varphi))}$ |
| SEMI CONFORMAL | 0 < C < 1 | to satisfy an ion based net deposition rate should be produced (OVERHANG) | $n_M \geq \dfrac{Y(\varphi, E)}{K_1(1 - R(\varphi))}$ | arriving ion based contribution must be larger than surface neutral metal generation (OVERHANG) $n_M \geq \dfrac{Y(\varphi, E)}{K_1(1 - R(\varphi)) - (K_2 + K_3 n_e)n_{Ar}}$ | |
| OVER CONFORMAL | C > 1 | to satisfy an ion based net deposition rate should be produced | $n_M \geq \dfrac{Y(\varphi, E)}{K_1(1 - R(\varphi))}$ | arriving ion based contribution must be larger than surface neutral metal generation, last one larger than arriving neutrals flux $n_M > \dfrac{Y(\varphi, E)n_e}{B_1 + K_1 n_e + B_3 n_e n_{Ar} - [K_2 n_e n_{Ar} + K_3 n_e^2 n_{Ar}]}$ | |
| EROSION | C > 0 | depleted ion arriving flux comparing to resputtering (PUNCH THROUGH) | $n_M < \dfrac{Y(\varphi, E)}{K_1(1 - R(\varphi))}$ | depleted ion arriving flux comparing to resputtering | $n_M < \dfrac{Y(\varphi, E)}{K_1(1 - R(\varphi))}$ |

According to another embodiment, the process window for conformal coverage includes medium bias power (to the substrate), and $$0.1 \leq \left|\frac{n_M - n_e}{n_e}\right| \leq 1, \text{ or}$$

preferably $$\frac{n_{M,critical}}{n_e} \leq \left|\frac{n_M - n_e}{n_e}\right| \leq 1$$

Figure 10E:
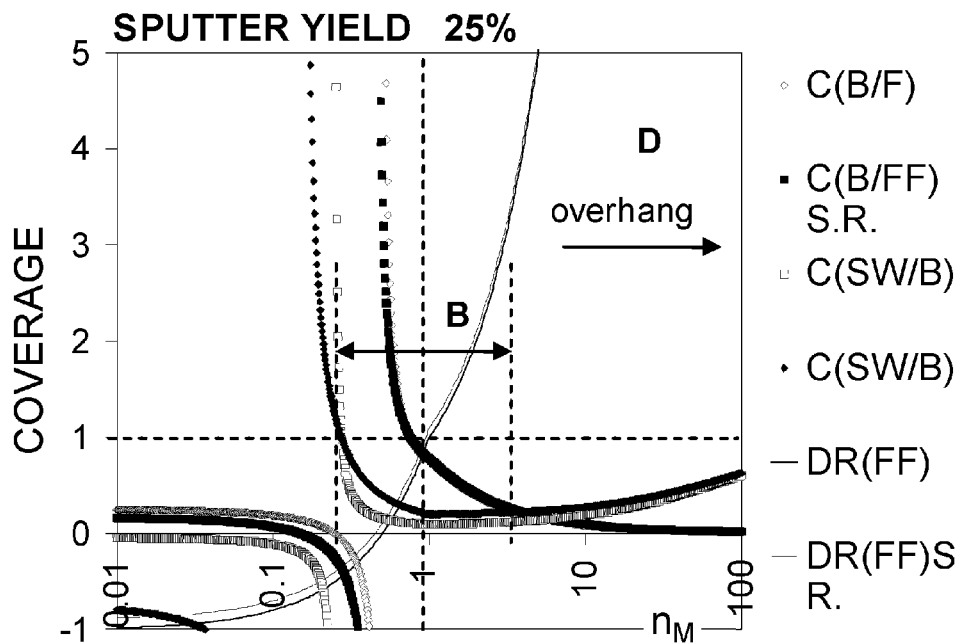
FIG. 10E presents the feature sidewall to bottom coverage and the feature bottom to flat field coverage for a fifth process condition.
Figure 10F:
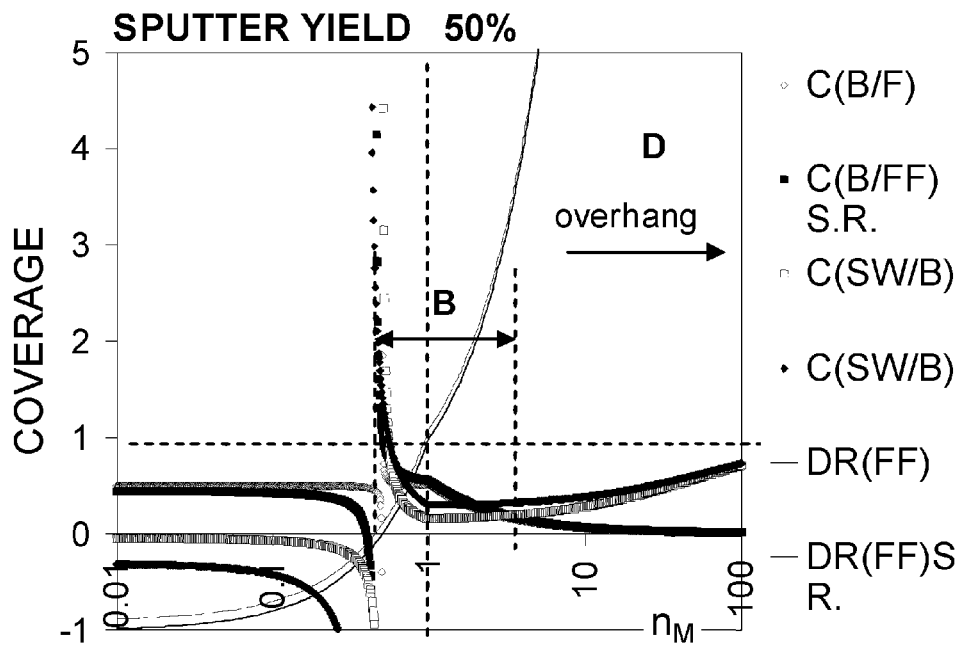
FIG. 10F presents the feature sidewall to bottom coverage and the feature bottom to flat field coverage for a sixth process condition.

(illustrated in FIGS. 10E, F, G at various bias conditions). In this process window, $C^{SW/B} \leq 1$, and it is comparable to $C^{SW/B} \approx C^{B/FF}$. The deposition rate is reasonable. Both $C^{SW/B}$ and $C^{B/FF}$ can be controlled by the metal source generation rate. The process window is larger for a lower bias, and it shrinks at higher bias conditions. Overhang formation rate is still relatively low.

Figure 10G:
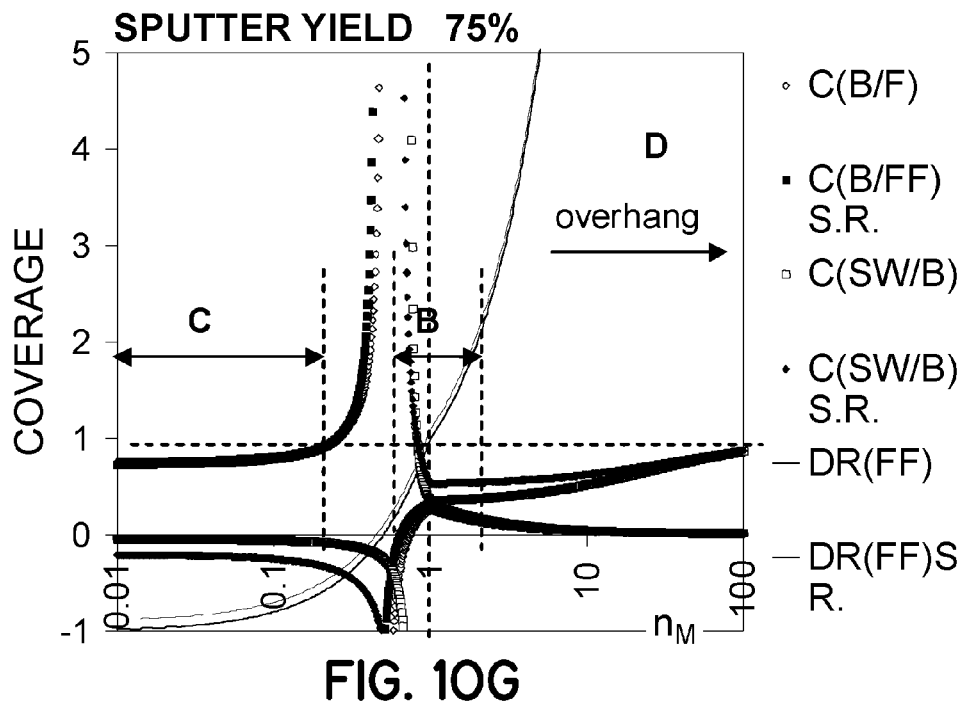
FIG. 10G presents the feature sidewall to bottom coverage and the feature bottom to flat field coverage for a seventh process condition.
Figure 10H:
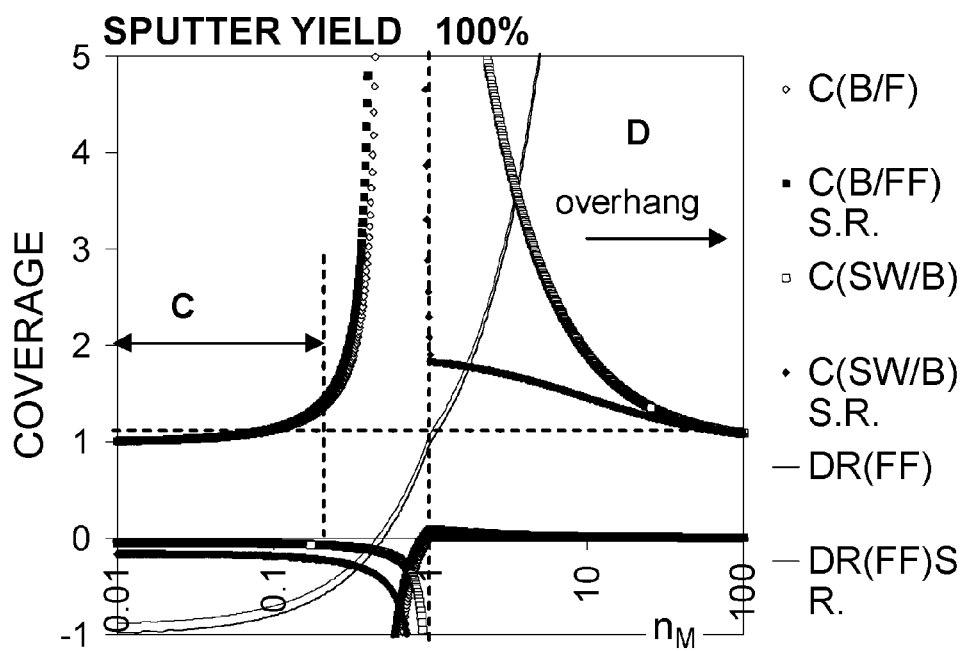
FIG. 10H presents the feature sidewall to bottom coverage and the feature bottom to flat field coverage for an eighth process condition.
Figure 11:
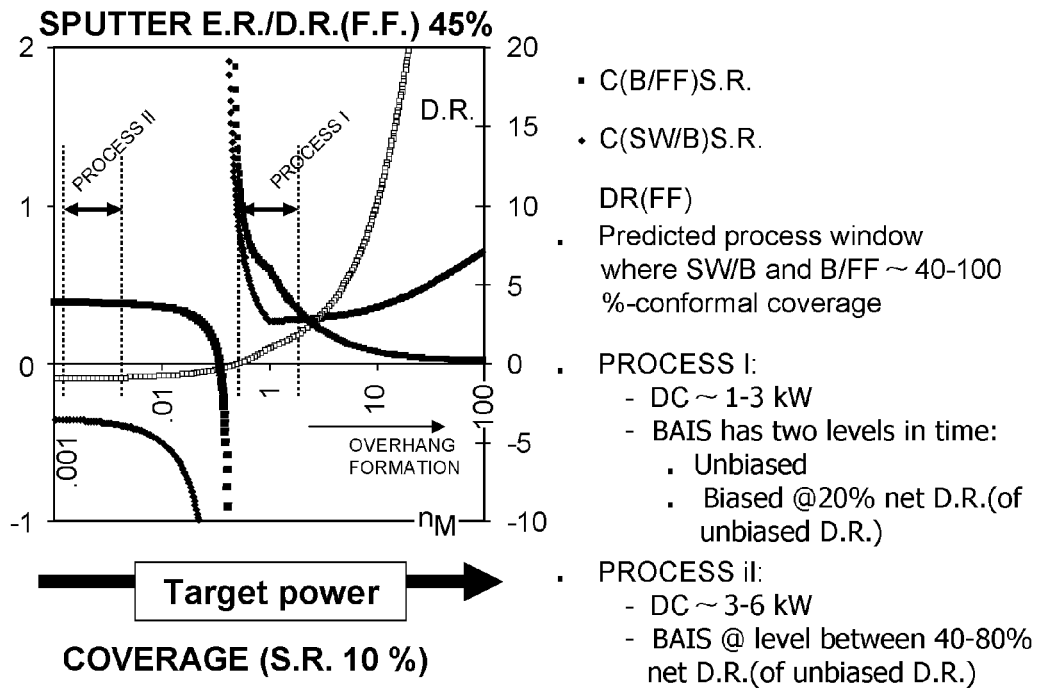
FIG. 11 illustrates an exemplary process window showing coverage as a function of metal density.

According to another embodiment, the process window for conformal coverage includes high bias power (to the substrate), and $n_M \geq n_e$ (illustrated in FIGS. 10G,H at various bias conditions). On the metal density scale, this process window is similar to the first process window for low bias power.

TABLE 2

COVERAGE SIDEWALL/BOTTOM

| | | NO SURFACE REACTIONS | | SURFACE REACTIONS | |
|---|---|---|---|---|---|
| LOW | C = 0 | does not have physical solution | $n_M < 0$ | does not have physical solution | $n_M < 0$ |
| CONFORMAL | C = 1 | does not have physical solution restricted solution (convergency under question) $n_M \gg n_M^{critical}\left(\dfrac{\text{flux}}{\text{bulk}}\right) \quad n_e \gg n_e^{critical}\left(\dfrac{\text{flux}}{\text{bulk}}\right)$ $A_k > A_R^{critical}(R(\varphi))$ | $n_M < 0$ | reflected and resputtered metal from bottom is balanced with exactly same amount of metal consumed at walls through surface reactions $n_M \gg n_M^{critical}\left(\dfrac{\text{flux\_from\_bulk}}{\text{surf\_reactions}}\right)$ $n_e \in \langle n_{e(1)}, n_{e(2)} \rangle$ | |
| SEMI-CONFORMAL | 0 < C < 1 | does not have physical solution | $n_M < 0$ | reflected and resputtered metal from bottom is larger than metal amount consumed at walls through surface reactions $n_M \gg n_M^{critical}\left(\dfrac{\text{flux\_from\_bulk}}{\text{surf\_reaction}}\right) \quad n_e \in \langle n_{e(1)}, n_{e(2)} \rangle$ | |

TABLE 2-continued

| | | COVERAGE SIDEWALL/BOTTOM | | | |
|---|---|---|---|---|---|
| | | NO SURFACE REACTIONS | | SURFACE REACTIONS | |
| OVER CONFORMAL | C > 1 | does not have physical solution | $n_M < 0$ | reflected and resputtered metal from bottom is lower than metal amount consumed at walls through surface reactions $n_M > n_M^{critical}\left(\dfrac{\text{flux\_from\_bulk}}{\text{surface\_reactions}}\right)$ | $n_e \in (n_{e(1)}, n_{e(2)})$ |
| EROSION | C < 0 | does not have physical solution | $n_M < 0$ | does not have physical solution | $n_M < 0$ |

This region can be applicable for applications to enhance bottom coverage without effecting sidewall coverage. It may also be used in sequence with processes operating in the low bias power process window in order to combine optimized sidewall-to-bottom coverage with enhanced bottom-to-flat field coverage without creating overhang structure. The conformality $C^{SW/B} \to 0$ in this process window.

According to another embodiment, the process window for conformal coverage includes $n_M > n_e$ (or more effective at $n_M \gg n_e$) which is characteristic by overhang formation due to increased deposition rate. This process window is exploited by current PVD and iPVD processes; however, due to overhang, it does not provide good coverage for high aspect ratio features.

In yet another embodiment, the process conditions are selected such that the plasma density is sufficiently high to allow reasonable deposition rates, and satisfy the condition $n_e > n_M$, e.g., $n_e \approx 10^{12} \to 10^{13}$ cm$^{-3}$ and higher. For example, a plasma density of approximately $n_e \to 10^{13}$ cm$^{-3}$ can provide sufficient deposition rates~10-100 nm/min for nanoscale deposition.

Additionally, the distributed metal source can deliver an optimized amount of metal satisfying the condition $n_M < n_e$, that is highly ionized at an arbitrary location above the substrate with reduced or even eliminated rarefaction impact and overhang formation. The distributed metal source can provide higher ionization, hence, providing higher uniformity by geometry and operation (small metal source is less coupled to plasma source).

Additionally, another process condition includes $n_{metal}/n_e = \text{const} \leq 1$, and $n_M \geq n_M^{critical}$. Sustaining a constant ratio of the metal density to plasma density over the whole substrate can provide conditions for surface reactions within the conformal coverage mode, thus uniform coverage of features or structures across the substrate can be achieved.

Following the results of the kinetic model described above, one process recipe for optimal feature coverage can include conditions extracted from the first (low bias power) and third process windows. For example, this process recipe can be provided by low metal source generation, and changing the bias of the substrate from a no bias condition to a medium bias condition (e.g., pulsing bias power). For a typical ICP plasma (using ionized metal for metalization of 300 mm wafers) with density of several $10^{12}$ cm$^{-3}$ at pressures from 30 to 100 mTorr, the density of metal $\leq 10^{11}$ cm$^{-3}$ (e.g., this can be achieved by 1-4 kW delivered from the DC power to the target) can be considered low enough to operate in the surface collision mode, e.g., in the first or third process window. At these conditions, the substrate bias can have two levels during process falling within the range from an unbiased substrate holder to a biased substrate holder at a level corresponding to a net deposition rate at the flat field of less than 20% of the unbiased deposition rate. For example, the substrate bias power can range from 0 W to several hundred Watts.

Another process recipe includes operation at medium bias conditions (i.e., the second process window, medium bias power), and metal source generation preset to comply with the condition $$\frac{n_{M,critical}}{n_e} \leq \left|\frac{n_M - n_e}{n_e}\right| \leq 1,$$

or in other words, the metal density is close to plasma density range. For example, the net deposition rate at the flat field is in the range from 50% to 80% of the deposition rate at unbiased conditions (e.g., the substrate bias power ranges from approximately from 300 W to 800 W). Additionally, for example, the DC power supplied to the target can range from approximately 2 to 6 kW in order to generate a total metal density comparable to the plasma density.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of depositing a film into high aspect ratio features on a substrate, the method comprising:
    disposing into a processing chamber, a substrate having features thereon of at least a 7:1 aspect ratio and less than 100 nm in width, the processing chamber having:
        a substrate support therein for supporting the substrate,
        a gas injection system for introducing a background gas into the processing chamber, and
        a distributed metal source comprised of at least one metal having an ionization potential that is less than an ionization potential of the background gas;
    introducing the background gas into the processing chamber;
    energizing at least one plasma source to inductively or capacitively couple energy into the background gas to form a high density plasma having a density of electrons that exceeds $10^{11}$ cm$^{-3}$;
    while the high density plasma is energized, continuously introducing an amount of the at least one metal into the high density plasma from the distributed metal source such that the high density plasma includes a density of background gas, a density of ionized background gas, a density of neutral metal, and a density of metal ion;

while continuously introducing the at least one metal, conformally depositing the film onto the high aspect ratio features of the substrate with a sidewall-to-field area thickness ratio that exceeds ½; and while the film is being conformally deposited, controlling the continuous introduction of the amount of the at least one metal such that the combined densities of neutral metal and metal ion in the high density plasma does not exceed the density of ionized background gas.

2. The method of claim 1, further comprising:
maintaining a ratio between the combined densities of neutral metal and metal ion to the density of ionized background gas that is substantially uniform across the surface of the substrate.

3. The method of claim 1, further comprising:
maintaining a ratio between the combined densities of neutral metal and metal to the density of ionized background gas while varying at least one of the densities as a function of time.

4. The method of claim 1, wherein the at least one plasma source includes one or more plasma generating elements.

5. The method of claim 1, wherein the distributed metal source is configured to perform at least one of adjusting or controlling a spatial distribution of at least one of the density of neutral metal and the density of metal ions at a plasma boundary.

6. The method of claim 1, further comprising:
coupling a buffer device to the processing chamber and controlling the buffer device to adjust at least one of the combined densities of neutral metal and metal ion and the density of ionized background gas proximate to the substrate in the processing chamber.

7. The method of claim 6, further comprising:
electrically biasing the buffer device to control the buffer device.

8. The method of claim 6, further comprising:
coupling a magnet system to the buffer device to adjust at least one of the combined densities of neutral metal and metal ion and the density of ionized background gas proximate to the substrate in the processing chamber.

9. The method of claim 8, wherein the magnet system includes at least one of a permanent magnet array, an electromagnet, a rotating magnet, a translatable magnet, or a stationary magnet.

10. The method of claim 8, wherein the buffer device is translatable, in a direction substantially perpendicular to the substrate to adjust at least one of the combined densities of neutral metal and metal ion and the density of ionized background gas proximate to the substrate in the processing chamber.

11. The method of claim 1, wherein the density of electrons in the high density plasma exceeds $10^{12}$ cm$^{-3}$.

12. The method of claim 1, wherein the conformally depositing step includes depositing the film having a maximum thickness on a surface of the substrate that is less than half the width of the high-aspect ratio features.

13. The method of claim 1, wherein the conformally depositing step includes depositing the film having a maximum thickness on a surface of the substrate that is less than approximately one-tenth of the width of the high-aspect ratio features.

14. The method of claim 1, further comprising:
controlling a ratio between the combined densities of neutral metal and metal ions to the density of ionized background gas by adjusting the combined densities of neutral metal and metal ion at a plasma boundary adjacent the substrate by controlling a bias at the substrate.

15. The method of claim 14, further comprising:
controlling said ratio by also adjusting the combined densities of neutral metal and metal ion by controlling the introducing of the at least one metal from the distributed metal source.

16. The method of claim 14, further comprising:
controlling the ratio by also adjusting the density of ionized background gas.

17. The method of claim 1, wherein the background gas is argon.

* * * * *

UNITED STATES PATENT AND TRADEMARK OFFICE
CERTIFICATE OF CORRECTION

| | | |
|---|---|---|
| PATENT NO. | : 8,092,658 B2 | |
| APPLICATION NO. | : 11/835067 | |
| DATED | : January 10, 2012 | |
| INVENTOR(S) | : Jozef Brcka | |

It is certified that error appears in the above-identified patent and that said Letters Patent is hereby corrected as shown below:

Cover Sheet, Col. 2, ABSTRACT, first line of first sentence, "therefore is" should read --therefore are--.

Cover Sheet, Col. 2, ABSTRACT, fourth line of first sentence, "high density plasma is described." should read --high density plasma.--.

Col. 1, line 35, "thickness are" should be --thickness is--.

Col. 3, line 6, "substrate comprising:" should read --substrate comprises:--.

Col. 5, line 52, "operation to affect" should read --operation to effect--.

Col. 11, line 35, --(5) (Penning excitation of the argon)-- should be added after the equation.

Col. 11, line 40, --(6) (charge exchange)-- should be added after the equation.

Col. 11, line 45, --(7) (Penning ionization of the metal)-- should be added after the equation.

Col. 12, lines 16-17, "is considered" should read --are considered--.

Col. 12, line 45, --(8) (Penning excitation of the argon)-- should be added after the equation.

Col. 12, line 50, --(9) (charge exchange)-- should be added after the equation.

Col. 12, line 56, --(10) (Penning ionization of the metal)-- should be added after the equation.

Col. 13, line 1, --(11) (ion deposition mechanism)-- should be added after the equation.

Signed and Sealed this
Tenth Day of April, 2012

David J. Kappos
*Director of the United States Patent and Trademark Office*

CERTIFICATE OF CORRECTION (continued)
U.S. Pat. No. 8,092,658 B2

Col. 13, lines 24-26,

"
$$D.R.^B(n_e, n_M) \approx \Theta(H)B_1 n_M + K_1 n_e n_M [1 - R(\varphi_B)] - Y(\varphi, E) n_e +$$
$$+ \Theta(H)^2 B_3 n_e n_M n_{Ar} - \Theta(H) K_2 n_e n_M n_{Ar} \Theta(H) K_3 n_e^2 n_M n_{Ar}$$
"

should read

--
$$D.R.^B(n_e, n_M) \approx \Theta(H)B_1 n_M + K_1 n_e n_M [1 - R(\varphi_B)] - Y(\varphi, E) n_e +$$
$$+ \Theta(H)^2 B_3 n_e n_M n_{Ar} - \Theta(H) K_2 n_e n_M n_{Ar} - \Theta(H) K_3 n_e^2 n_M n_{Ar}$$
--.

Col. 13, line 49, "aspect ration" should read --aspect ratio--.

Col. 15, second equation, fourth column, "R(Φ)=0" should read --R( )=0--.

Col. 17, line 17, "without effecting" should read --without affecting--.

Col. 18, line 33, "approximately from 300 W to 800 W)." should read --approximately 300 W to 800 W).--.

Col. 19, line 17, Claim 3, "and metal to the density" should read --and metal ions to the density--.